(12) United States Patent
Suzuki et al.

(10) Patent No.: US 6,652,997 B2
(45) Date of Patent: Nov. 25, 2003

(54) ORGANIC LUMINESCENCE DEVICE

(75) Inventors: Koichi Suzuki, Yokohama (JP); Mizuho Hiraoka, Kawasaki (JP); Akihiro Senoo, Kawasaki (JP); Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/127,591

(22) Filed: Apr. 23, 2002

(65) Prior Publication Data

US 2003/0008174 A1 Jan. 9, 2003

(30) Foreign Application Priority Data

Apr. 27, 2001 (JP) ........................................ 2001/131361

(51) Int. Cl.$^7$ ............................................. H05B 33/12
(52) U.S. Cl. ..................... 428/690; 428/917; 313/504; 313/506
(58) Field of Search ................................ 428/690, 917; 313/504, 506

(56) References Cited

U.S. PATENT DOCUMENTS

| 4,539,507 A | 9/1985 | VanSlyke et al. | 313/504 |
|---|---|---|---|
| 4,720,432 A | 1/1988 | VanSlyke et al. | 428/457 |
| 4,885,211 A | 12/1989 | Tang et al. | 428/457 |
| 5,130,603 A | 7/1992 | Tokailin et al. | 313/504 |
| 5,151,629 A | 9/1992 | VanSlyke | 313/504 |
| 5,227,252 A | 7/1993 | Murayama et al. | 428/690 |
| 5,247,190 A | 9/1993 | Friend et al. | 257/40 |
| 5,317,169 A | 5/1994 | Nakano et al. | 257/40 |
| 5,382,477 A | 1/1995 | Saito et al. | 428/690 |
| 5,409,783 A | 4/1995 | Tang et al. | 428/690 |
| 5,514,878 A | 5/1996 | Holmes et al. | 257/40 |
| 5,672,678 A | 9/1997 | Holmes et al. | 528/373 |
| 5,726,457 A | 3/1998 | Nakano et al. | 257/40 |
| 6,093,864 A | 7/2000 | Tokailin et al. | 585/25 |

FOREIGN PATENT DOCUMENTS

| JP | 2-247278 | 10/1990 |
|---|---|---|
| JP | 3-255190 | 11/1991 |
| JP | 4-145192 | 5/1992 |
| JP | 5-202356 | 8/1993 |
| JP | 5-247460 | 9/1993 |
| JP | 6-184125 | 7/1994 |
| JP | 9-202878 | 8/1997 |
| JP | 9-227576 | 9/1997 |
| JP | 9-286980 | 11/1997 |
| JP | 9-291274 | 11/1997 |

OTHER PUBLICATIONS

M.J. Plater, et al., "A New Synthesis of Truxenone", Tetrahedron Lett., vol. 38, No. 6, pp. 1081–1082 (1997). (no month).

K. Jacob, et al., "Synthesis of Novel Truxenequinone Based Electron Accceptors", Tetrahedron Lett., vol. 40, pp. 8625–8628 (1999). (no month).

J.H. Burroughes, et al., "Light–Emitting Diodes Based on Conjugated Polymers", Nature, vol. 347, pp. 539–541 (Oct. 1990).

C.W. Tang, et al., "Organic, Electroluminescent Diodes", Appl. Phys. Lett., vol. 51, No. 12, pp. 913–915 (Sep. 1987).

F. Diederich, et al., "Synthetic Approaches toward Molecular and Polymeric Carbon Allotropes", Angew. Chem. Int. Ed. Engl., vol. 31, No. 9, pp. 1101–1123 (Sep. 1992).

*Primary Examiner*—Marie Yamnitzky
(74) *Attorney, Agent, or Firm*—Fitzpatrick, Cella, Harper & Scinto

(57) ABSTRACT

An organic luminescence device is constituted by an anode and a cathode and at least one organic layer disposed between the anode and the cathode. The above-mentioned at least one organic layer includes a layer of a fused polynuclear compound represented by the following formula (I):

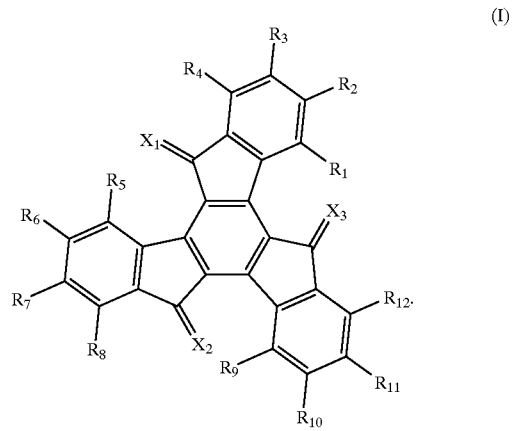

In the above formula (I), $X_1$, $X_2$ and $X_3$ may preferably be an oxygen atom or $C(CN)_2$. The device using the fused polynuclear compound of formula (I) exhibits a high luminance luminescence characteristic for a long period of time.

10 Claims, 3 Drawing Sheets

ORGANIC LUMINESCENCE DEVICE

BACKGROUND OF THE INVENTION

The present invention relates to an organic luminescence device using a specific fused polynuclear (or polycyclic) compound, particularly an organic luminescence device wherein an electric field is applied to a film of an organic compound comprising the fused polynuclear compound thereby causing luminescence.

An organic luminescence device is a device such that a thin film containing a fluorescent organic compound is sandwiched between an anode and a cathode, and holes and electrons are injected from the anode and the cathode, respectively, into the fluorescent organic compound layer to generate excitons which emit light when returned to a ground state.

For example, according to Eastman Kodak's study, Appl. Phys. Lett., vol. 51, p. 913 (1987), when a voltage of about 10 volts is applied to a function separation-type organic luminescence device including two layers of an aluminum quinolinol complex (as electron transport and luminescence material) and a triphenylamine derivative (as hole transport material) disposed between an ITO (indium tin oxide) anode and a magnesium-silver alloy cathode, an emission luminance of about 1000 cd/m$^2$ is obtained. Related patents thereto are, e.g., U.S. Pat. Nos. 4,539,507, 4,720,432, and 4,885,211.

Further, it is possible to effect luminescence ranging from the ultraviolet region to the infrared region by appropriately changing the species of fluorescent organic compound used. In recent years, studies on various fluorescent organic compounds have been made extensively as, e.g., described in U.S. Pat. Nos. 5,151,629, 5,409,783, and 5,382,477; and Japanese Laid-Open Patent Application (JP-A) Nos. 2-247278 (corr. to U.S. Pat. Nos. 5,130,603 and 6,093,864), 3-255190 (corr. to U.S. Pat. No. 5,227,252), 5-202356, 9-202878, and 9-227576.

In addition to the above-mentioned organic luminescence devices using low molecular weight materials, an organic luminescence device using a conjugated system polymer has been reported by a research group at Cambridge University (Nature, vol. 347, p. 539 (1990)). According to this report, by forming a single layer of PPV (polyphenylenevinylene) by means of wet coating, luminescence from the layer has been confirmed.

Related patents as to organic luminescence devices using conjugated system polymers may include: U.S. Pat. Nos. 5,247,190, 5,514,878, and 5,672,678 and JP-A 4-145192 (corr. to U.S. Pat. Nos. 5,317,169 and 5,726,457) and JP-A 5-247460.

As described above, recent progress with respect to organic luminescence devices is noticeable. More specifically, it is possible to realize a thin and lightweight luminescence device allowing high luminance at low applied voltage, variety of emission wavelengths and high speed responsiveness, thus suggesting possibilities of application to various uses.

However, the organic luminescence devices are required to exhibit further improved performances such as light output at high luminance and high conversion efficiency. Further, the organic luminescence devices have been accompanied with problems in terms of durability such as a change in luminance with time due to continuous use for a long time and deterioration (e.g., an occurrence of dark spots due to leakage of current) by ambient gas containing oxygen or by humidity.

As fluorescent organic compounds for use in an electron injection layer and/or an electron transport layer, a large number of heterocyclic compounds have been proposed as described in, e.g., JP-A 6-184125, 9-286980 and 9-291274. However, resultant emission luminances and durabilities and luminescence efficiencies have still been insufficient.

SUMMARY OF THE INVENTION

A principal object of the present invention is to provide an organic luminescence device having solved the above-mentioned problems.

A specific object of the present invention is to provide an organic luminescence device capable of effecting output of light with very high efficiency and luminance using a specific fused polynuclear aromatic compound.

Another object of the present invention is to provide an organic luminescence device having high durability.

A further object of the present invention is to provide an organic luminescence device which can be prepared readily and relatively inexpensively.

According to the present invention, there is provided an organic luminescence device comprising a pair of an anode and a cathode and at least one organic layer disposed between the anode and the cathode, wherein the at least one organic layer described above comprises a layer comprising at least one species of a fused polynuclear compound represented by the following formula (I):

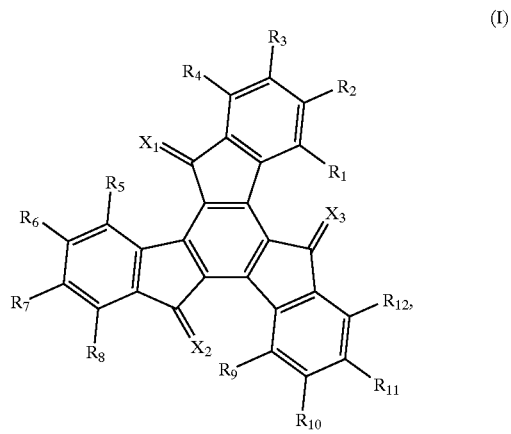

(I)

wherein $R_1$ to $R_{12}$ independently denote a hydrogen atom, an alkyl group, a substituted or unsubstituted aralkyl group, a substituted or unsubstituted aryl group, a substituted or unsubstituted heterocyclic group, a substituted amino group, a cyano group or a halogen atom; $R_1$ to $R_4$, $R_5$ to $R_8$ and $R_9$ to $R_{12}$ being independently capable of including adjacent two groups forming a substituted or unsubstituted aliphatic cyclic structure, a substituted or un-substituted aromatic ring structure, or a substituted or unsubstituted heterocyclic structure, and $X_1$, $X_2$ and $X_3$ independently denote an oxygen atom, a sulfur atom, $C(CN)_2$, $C(CF_3)_2$, $C(Ar_1)Ar_2$ or N—$Ar_3$, wherein $Ar_1$, $Ar_2$ and $Ar_3$ independently denote a substituted or unsubstituted aryl group or a substituted or unsubstituted heterocyclic group, $Ar_1$ and $Ar_2$ being capable of forming a ring structure.

In the above formula (I), at least one of $X_1$, $X_2$ and $X_3$ may preferably be $C(CN)_2$. Particularly, $X_1$, $X_2$ and $X_3$ may desirably be $C(CN)_2$ at the same time as shown by the following formula (II):

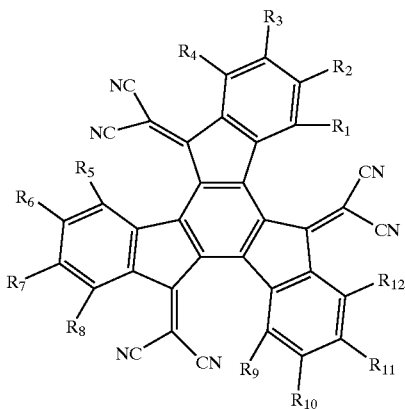

In another preferred embodiment, $X_1$, $X_2$ and $X_3$ may desirably be O (oxygen atom) at the same time as shown by the following formula (III):

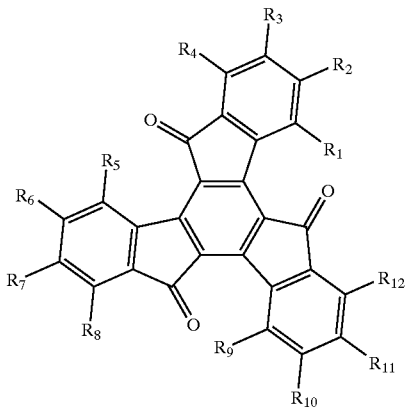

Further, in the present invention, the above-mentioned layer of fused polynuclear compound of formula (I), preferably formula (II) or (III), may desirably be any one of an electron injection layer, an electron transport layer and a hole blocking layer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
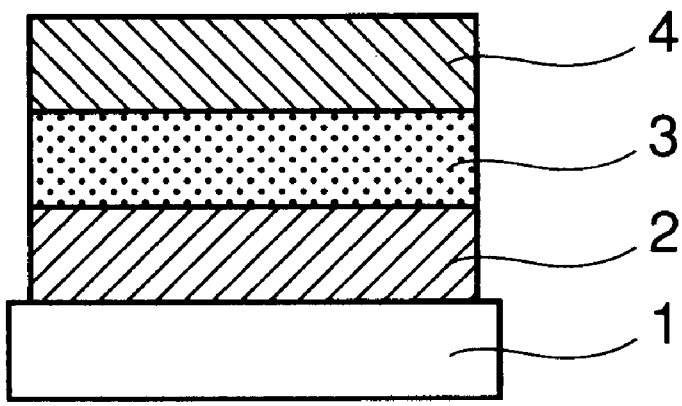
FIGS. 1 to 6 are respectively a schematic sectional view showing an embodiment of the organic luminescence device according to the present invention.

Hereinbelow, the present invention will be described more specifically.

The organic luminescence device according to the present invention comprises a pair of electrodes composed of an anode and a cathode and at least one organic layer disposed between the pair of electrodes. Examples of such an organic layer may include a luminescence layer, a hole transport layer, an electron transport layer, an electron injection layer and a hole blocking layer.

In the present invention, the above-mentioned at least one organic layer may preferably have one to six layer structures specifically described hereinafter with reference to FIGS. 1–6.

In the present invention, at least one organic layer described above may preferably include at least one layer comprising a fused polynuclear compound represented by any one of the above-mentioned formulae (I) to (III).

Specific examples of $R_1$ to $R_{12}$ and $Ar_1$ to $Ar_3$ in formulae (I) to (III) for the fused polynuclear compound used in the present invention will be shown below.

Examples of alkyl group may include methyl, ethyl, n-propyl, isopropyl, n-butyl, tert-butyl and octyl.

Examples of aralkyl group may include benzyl and phenethyl.

Examples of aryl group may include phenyl, biphenyl, terphenyl, naphthyl, anthryl, phenanthryl, pyrenyl, tetracenyl, pentacenyl and fluorenyl.

Examples of heterocyclic group may include thienyl, pyrrolyl, pyridyl, quinolyl, carbazolyl, oxazolyl, oxadiazolyl, thiazolyl, thiadiazolyl, terthienyl and terpyrrolyl.

Examples of substituted amino group may include dimethylamino, diethylamino, dibenzylamino, diphenylamino, ditolylamino and dianisolylamino.

Examples of aliphatic cyclic structure may include cyclopropane ring and cyclohexane ring.

Examples of aromatic ring structure and heterocycle structure may include rings comprising those for aryl group and heterocyclic group, respectively.

Examples of substituents for the above-mentioned groups (or structures) for $R_1$ to $R_{12}$ and $Ar_1$ to $Ar_3$ may include: alkyl groups such as methyl, ethyl and propyl; aralkyl groups such as benzyl and phenethyl; aryl groups such as phenyl, naphthyl, anthryl, phenanthryl, pyrenyl, tetracenyl, pentacenyl, and fluorenyl; heterocyclic groups such as thienyl, pyrrolyl and pyridyl; amino groups such as dimethylamino, diethylamino, dibenzylamino, diphenylamino, ditolylamino and dianisolylamino; alkoxy groups such as methoxy, ethoxy, propoxy and phenoxy; cyano group; and nitro group.

Hereinafter, the fused polynuclear compounds of formulae (I) to (III) used in the present invention will be shown below specifically by their structural formulae (Example Compound Nos. 1 to 35) for the respective formulae (I) to (III) but are not restricted to the following specific compounds.

1
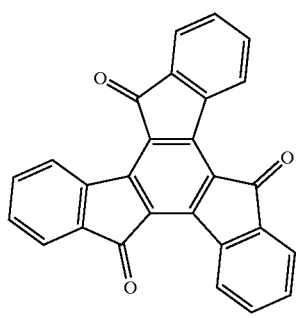
2
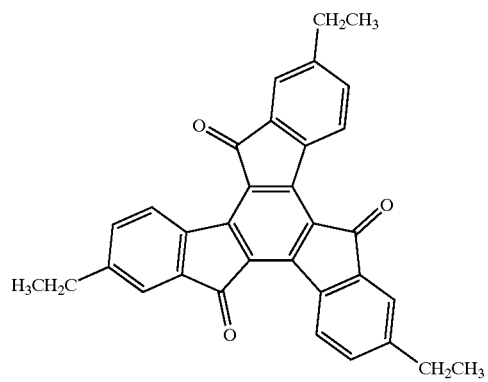
3
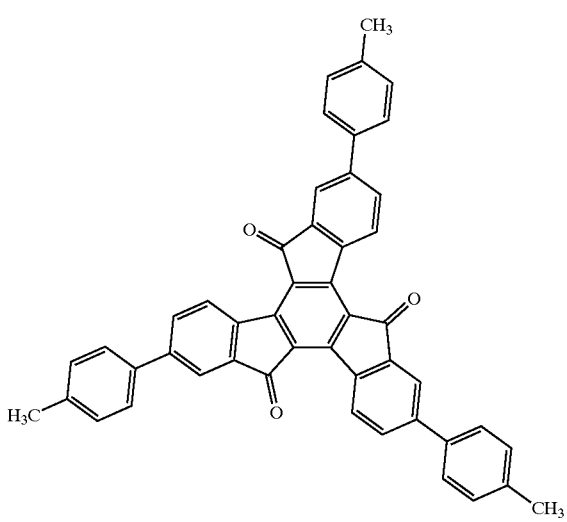
4
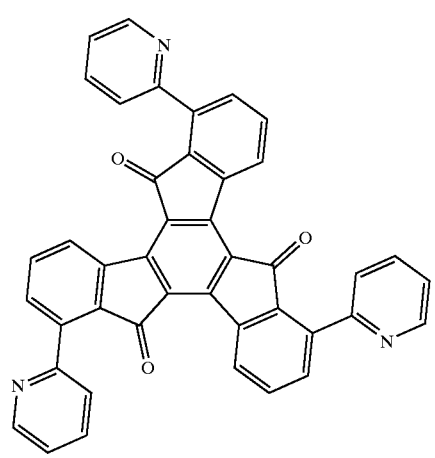
5
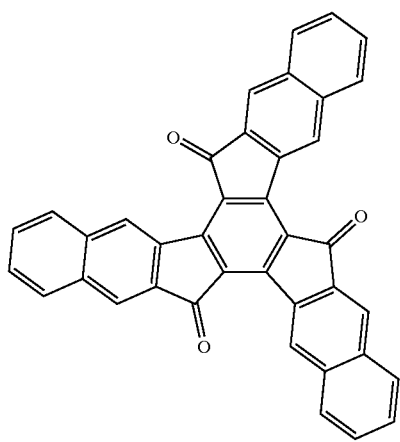
6
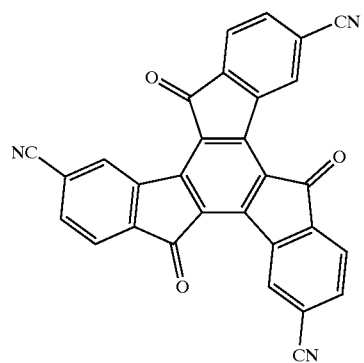

-continued
7
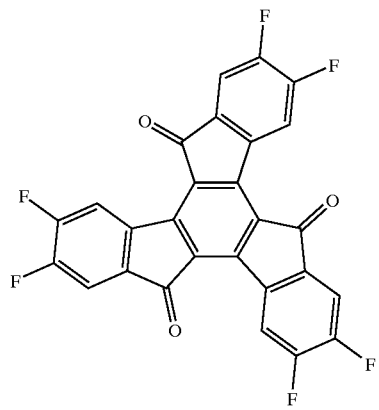
8
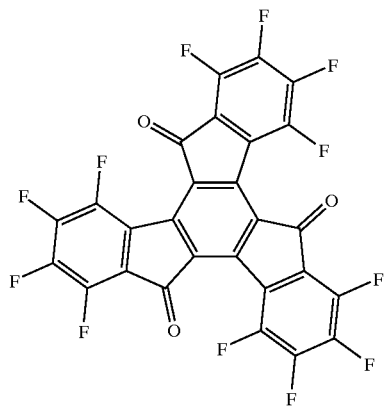
9
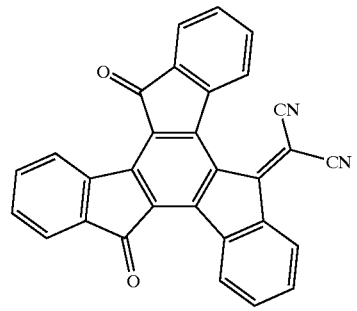
10
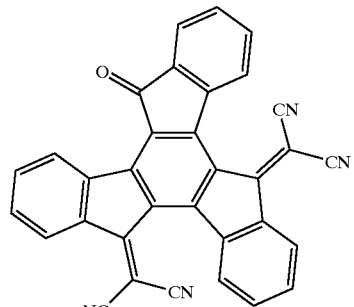
11
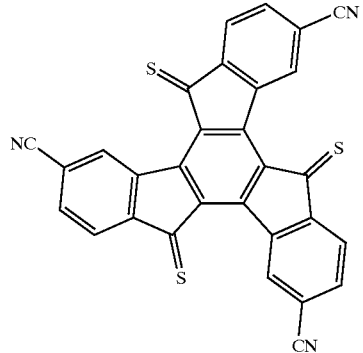
12
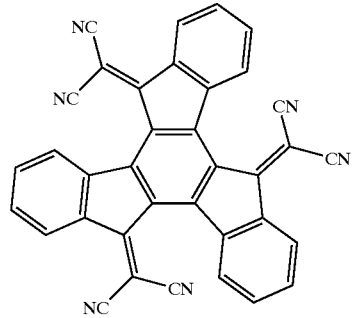
13
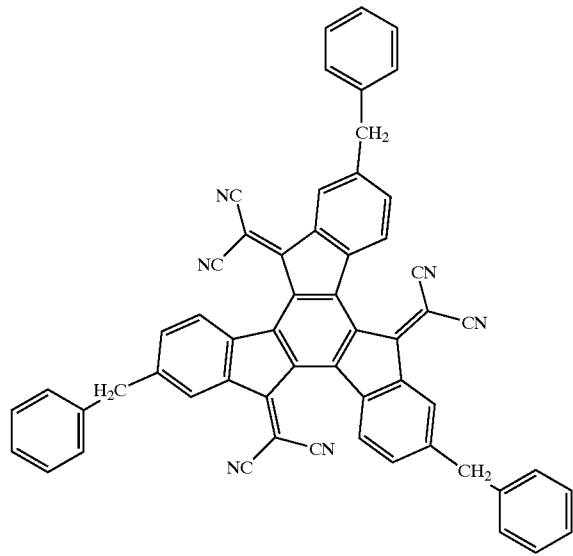
14
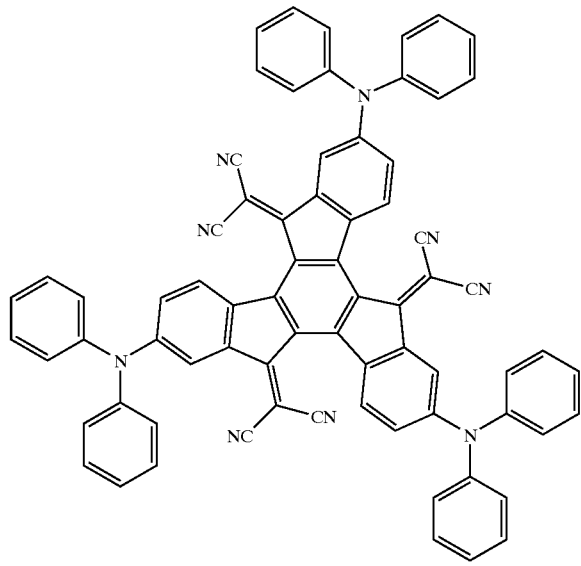

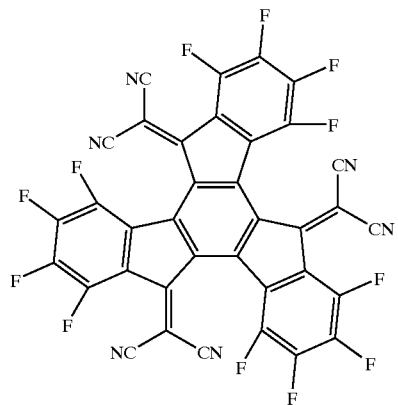
15
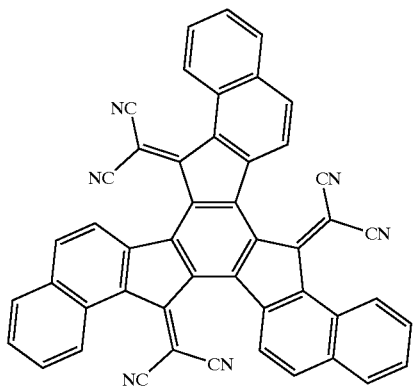
16
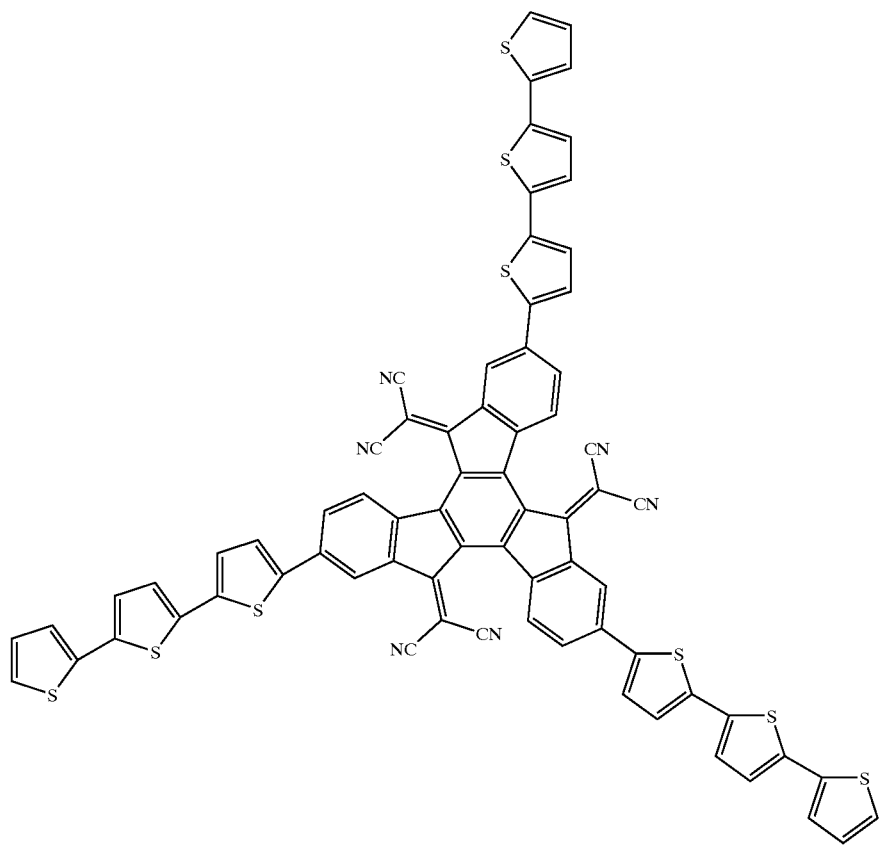
17

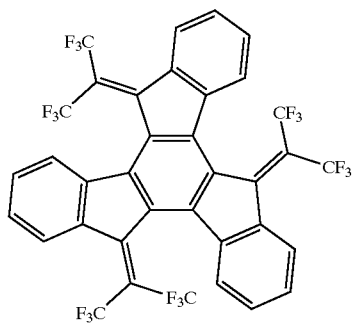
17
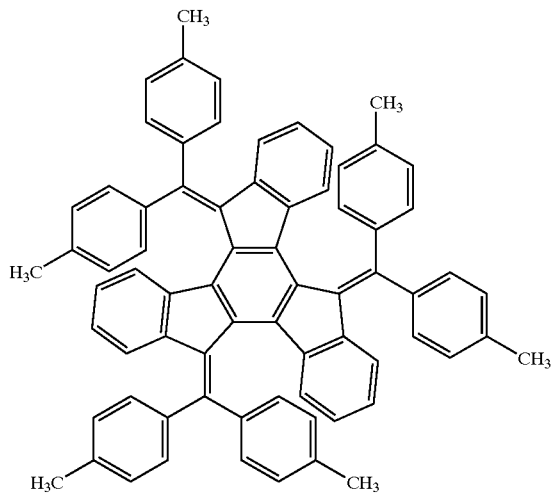
18
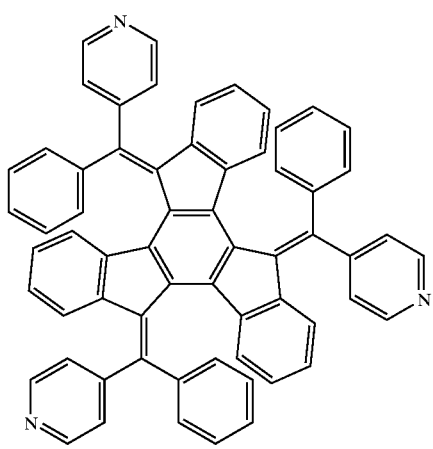
20
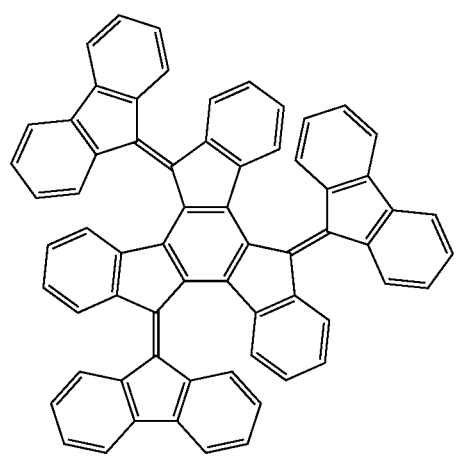
21
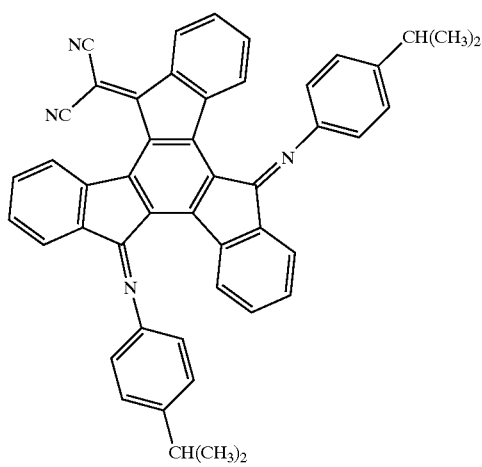
22
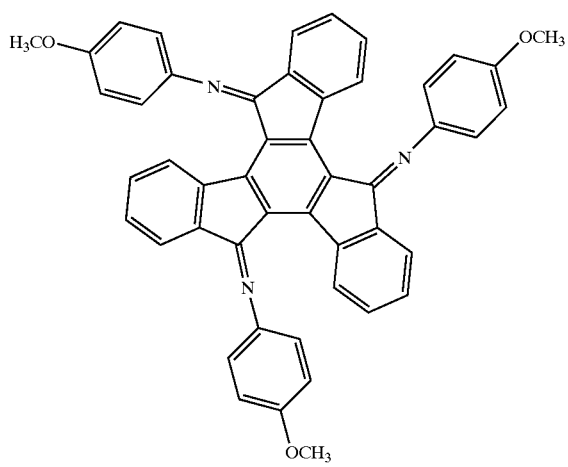
23

-continued
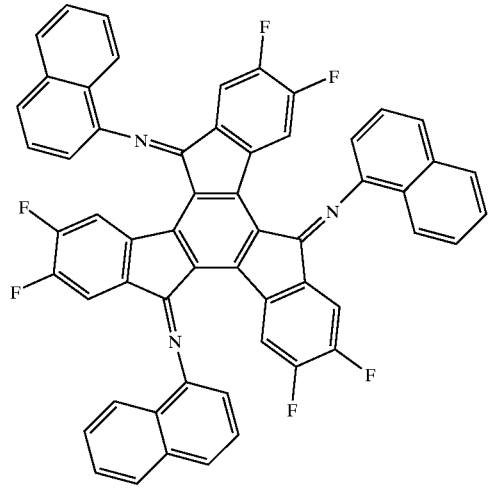
24
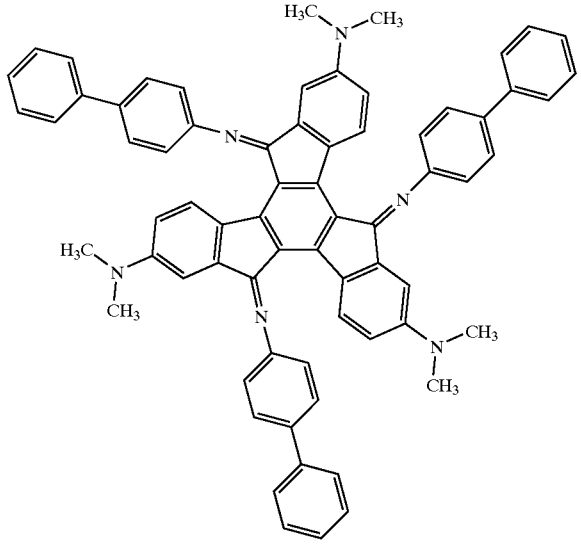
25
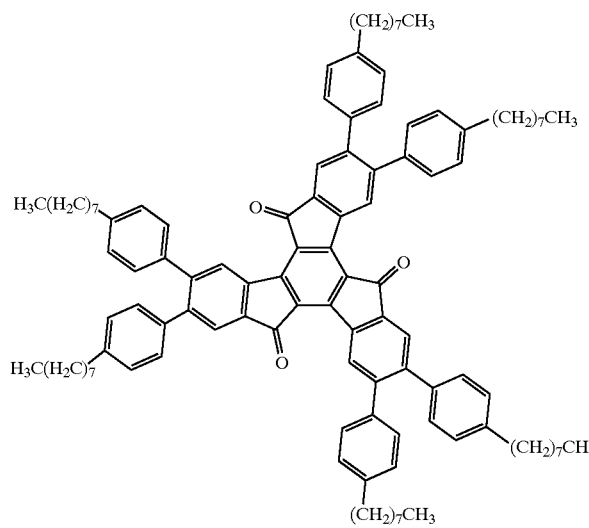
26
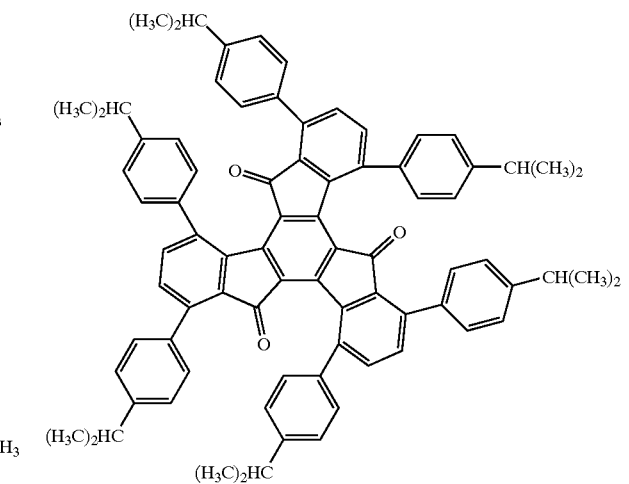
27

-continued
28
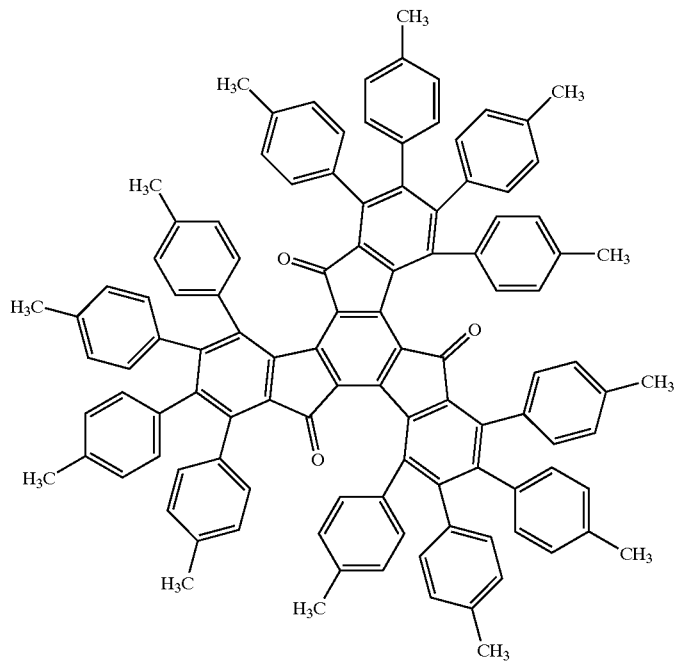
29
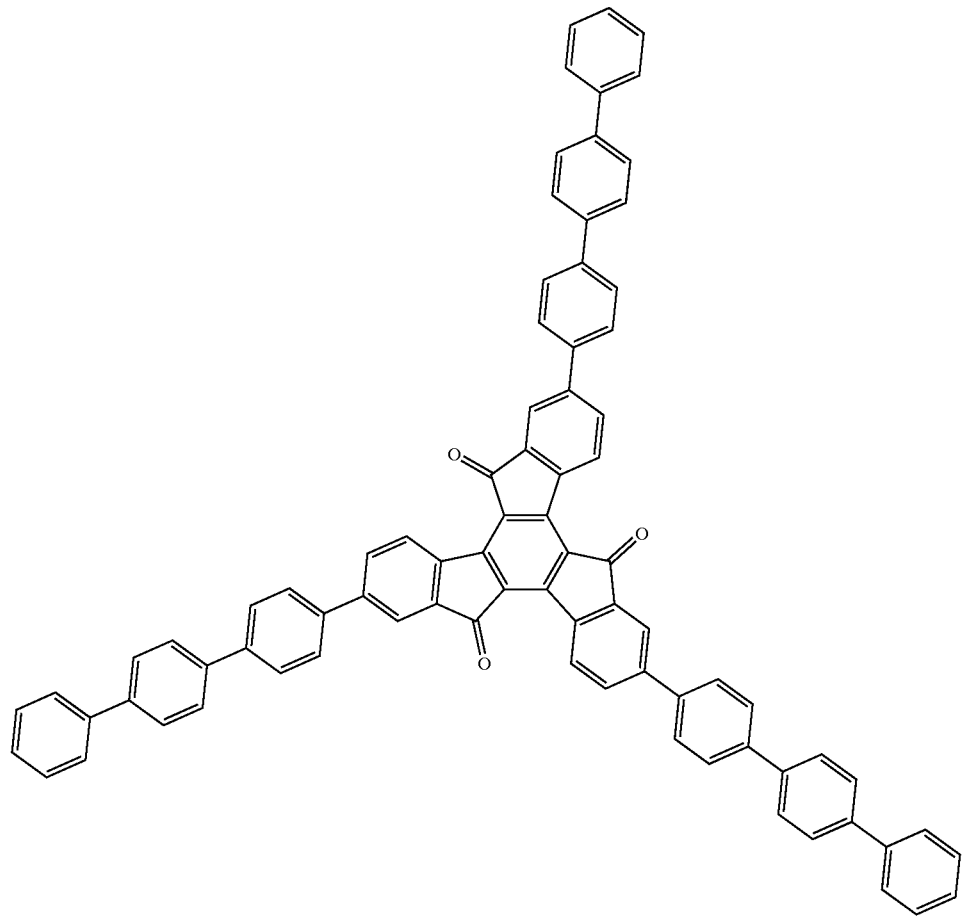

-continued
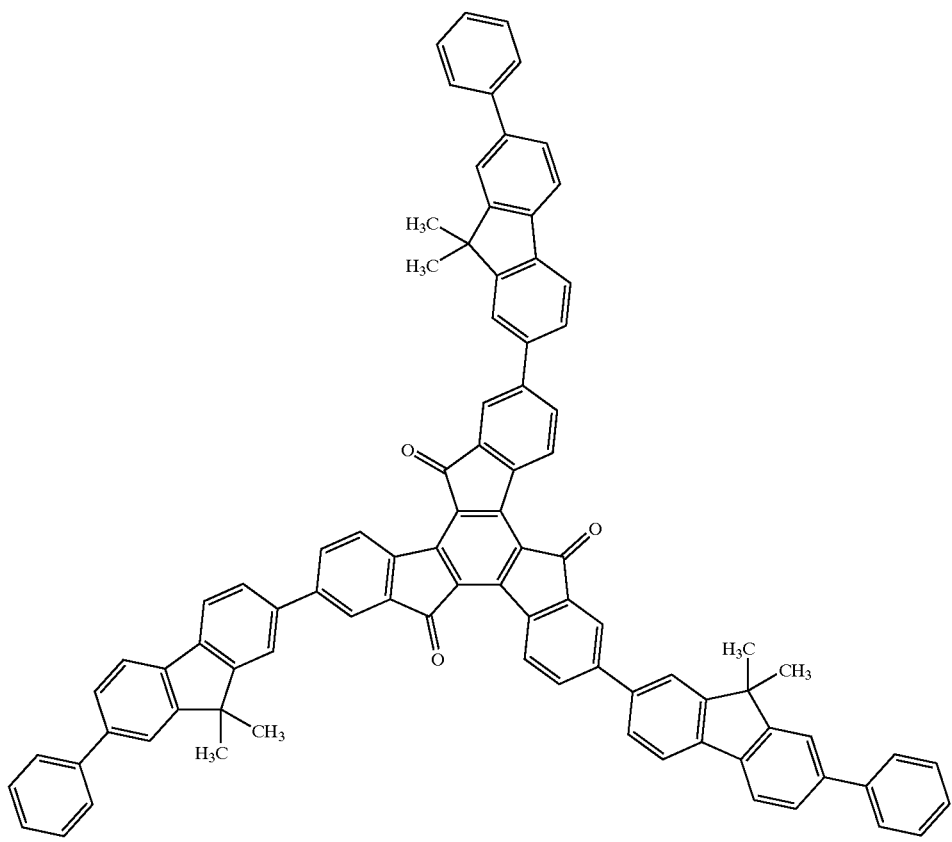
30
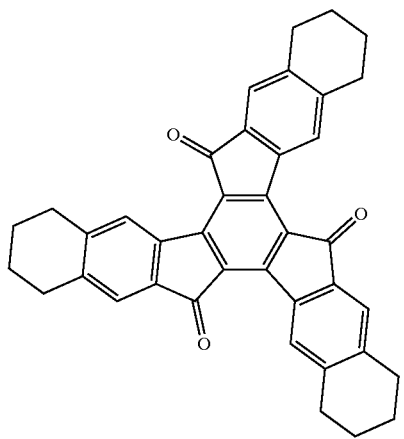
31

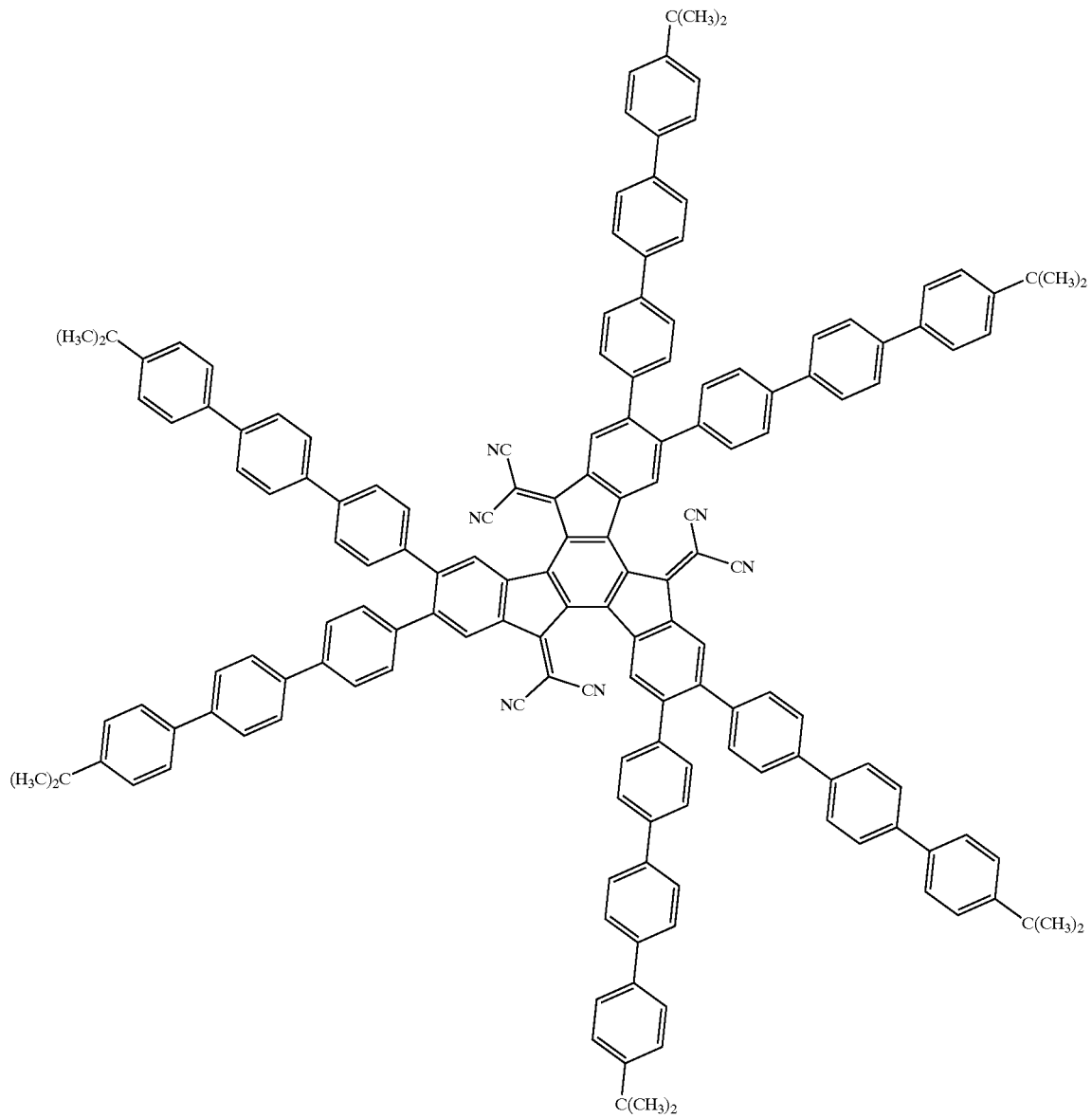
32

33

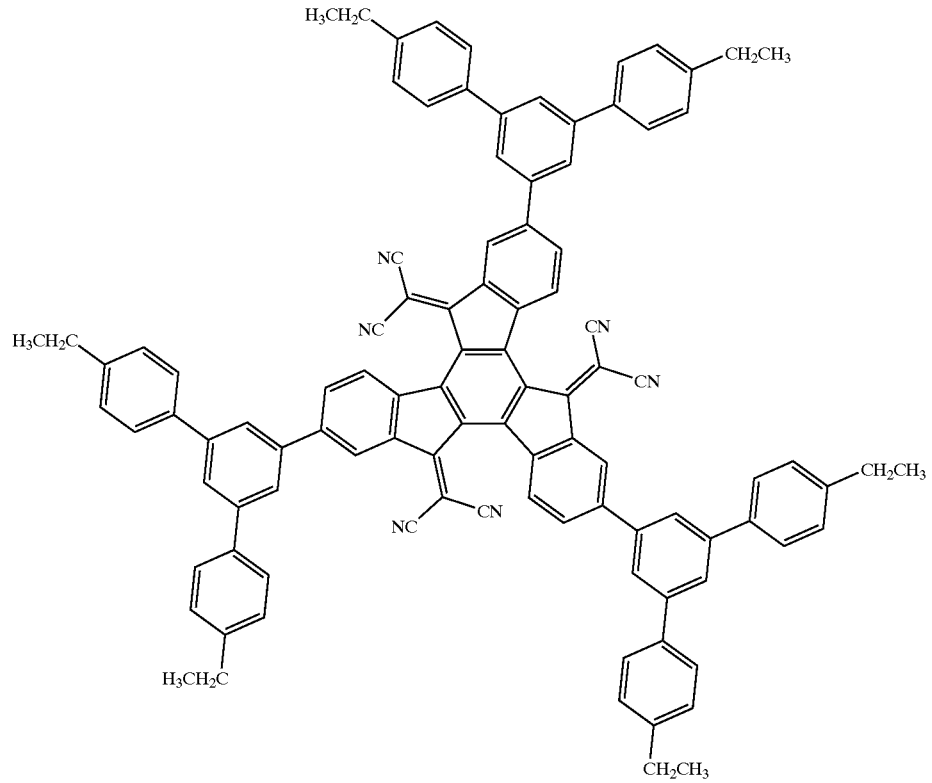

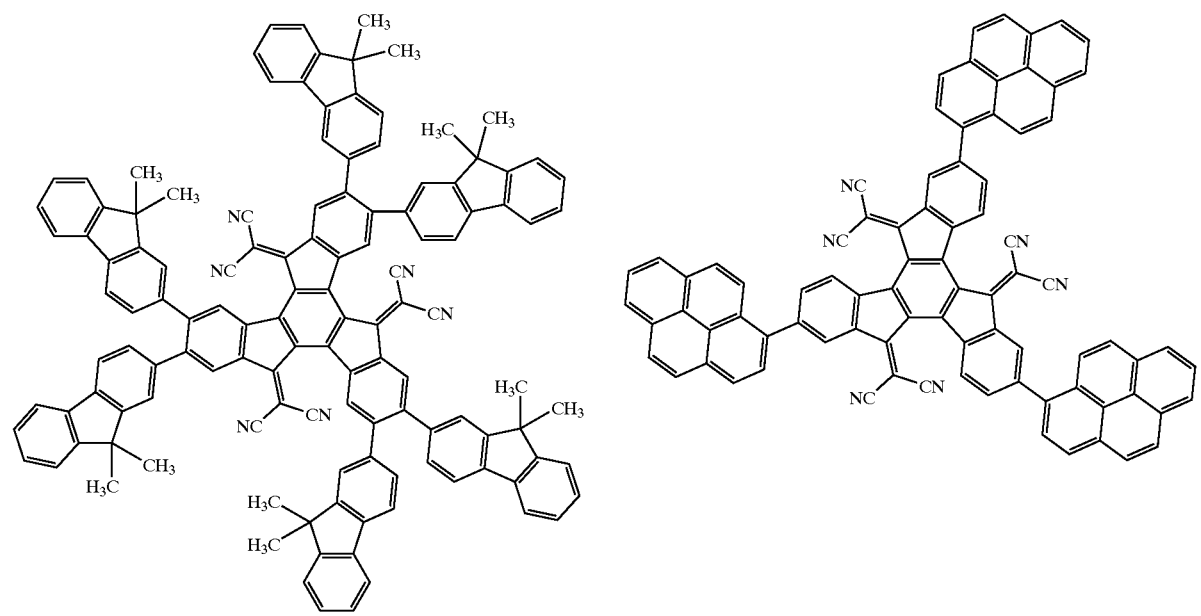

34

35

As apparent from the above fused polynuclear compounds of formulae (I), (II) and (III) (Ex. Comp. Nos. 1 to 35), the fused polynuclear compound used in the present invention may include truxenone (tribenzo[a,f,k]triindenone) (Ex. Comp. No. 1) and its derivatives.

More specifically, such derivatives of truxenone may include: a compound (Ex. Comp. No. 2) having three carbonyl portions (>C=O) and substituted aryl groups; a compound (Ex. Comp. No. 9) having one substituted carbonyl portion where the oxygen atom is replaced by a dicyan methyl group (C(CN)$_2$) (dicyan methylation); a compound (Ex. Comp. No. 11) having three substituted carbonyl portions where each oxygen atom is replaced by a sulfur atom; a compound (Ex. Comp. No. 18) having three substituted carbonyl portions where each oxygen atom is replaced by C(CF$_3$)$_2$; a compound (Ex. Comp. No. 19) having three substituted carbonyl portions where each oxygen atom is substituted by C(Ar$_1$)Ar$_2$

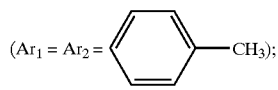

(Ar₁ = Ar₂ = —⟨benzene⟩—CH₃);

and a compound (Ex. Comp. No. 22) having one dicyan methyl group and two substituted carbonyl portions where each oxygen atom is replaced by N—Ar₃

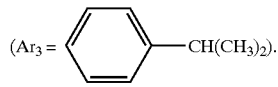

(Ar₃ = —⟨benzene⟩—CH(CH₃)₂).

Truxenone (Ex. Comp. No. 1) is a compound having a central benzene ring (six-membered ring) connected to three five-membered rings at three different positions and further connected to three benzene rings via each five-membered ring.

The fused polynuclear compound used in the present invention may preferably have a chemical structure comprising a central benzene ring, three five-membered rings connected to the central benzene ring, and three six-membered rings each different from the benzene ring and connected to the three five-membered rings, respectively, as shown by Ex. Comp. Nos. 1 to 35.

Further, three five-membered rings each having the carbonyl portion (>C=O) or carbonyl-corresponding portion (>C=) may include one or two rings different from the remaining ring(s) in the carbonyl or carbonyl-corresponding portion as in Ex. Comp. Nos. 9 and 22.

The fused polynuclear compound of formulae (I) to (III) used in the present invention may be synthesized through known processes including those as described in, e.g., Angew. Chem. Int. Ed. Engl., vol. 31, p. 1101 (1992), Tetrahedron Lett., vol. 38, p. 1081 (1997) and Tetrahedron Lett., vol. 40, p. 8625 (1999).

The first and second articles describe processes of synthesizing toluxenone and the third article describes a process for effecting dicyan methylation of carbonyl portions (>C=O).

The fused polynuclear compound of formulae (I) to (III) used in the present invention is an excellent organic luminescence functioning material in terms of at least one of electron injection performance, electron transfer performance, hole blocking performance and durability, compared with conventional compounds, thus being a material suitable for an organic layer, particularly an electron injection layer, an electron transport layer and/or a hole blocking layer. Further, when such an organic layer is formed by vacuum (vapor) deposition or wet coating using an appropriate solvent, the resultant organic layer is less likely to cause crystallization, thus being excellent in stability with time.

In the present invention, as described above, the organic layer disposed between the pair of electrodes (anode and cathode) may be formed in one or a plurality of organic compound layers including at least one layer thereof comprising the above-mentioned fused polynuclear compound of formulae (I) to (III). Further, such at least one layer may preferably function as an electron injection layer, an electron transport layer or a hole blocking layer.

Each of the organic (compound) layers may preferably be formed in a thickness of at most 10 μm, more preferably at most 0.5 μm, most preferably 0.01–0.5 μm.

Hereinbelow, layer structures of the organic luminescence device according to the present invention will be described specifically with reference to FIGS. 1 to 6, each illustrating a preferred embodiment thereof.

Referring to FIGS. 1–6, the respective organic luminescence devices basically include a substrate 1, an anode 2 disposed on the substrate 1, one or more organic layers disposed on the anode 2, and a cathode 4 disposed on the one or more organic layers.

In an embodiment shown in FIG. 1, the organic layer is composed of a single layer exhibiting multi-functional performances in terms of hole transport ability, electron transportability and luminescence performance. These performances may be given by using a single multi-functional compound or by mixing the respective functional materials in a single layer.

Figure 2:
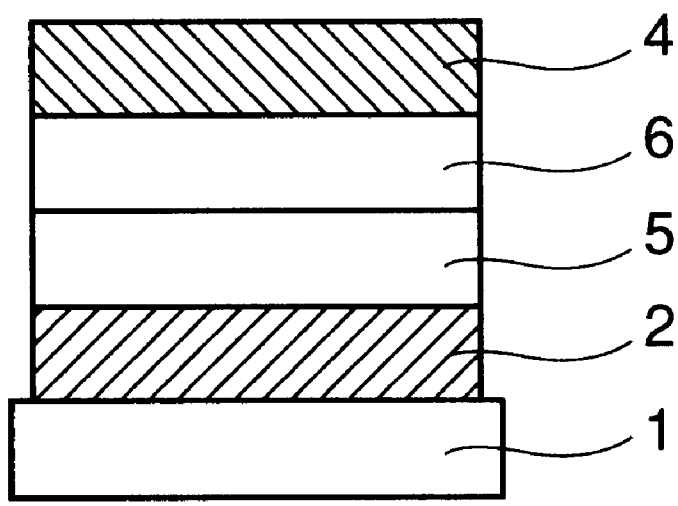

In another embodiment shown in FIG. 2, the organic layer is composed of a hole transport layer 5 disposed on the anode 2 and an electron transport layer 6 disposed on the hole transport layer 5. In this embodiment, a luminescent material also exhibits either one or both of hole transport performance and electron transport performance and is used in combination with a hole transport material free from luminescence performance or an electron transport material free from luminescence performance. In this embodiment, either one of the hole transport layer 5 and the electron transport layer 6 also functions as in the luminescence layer.

Figure 3:
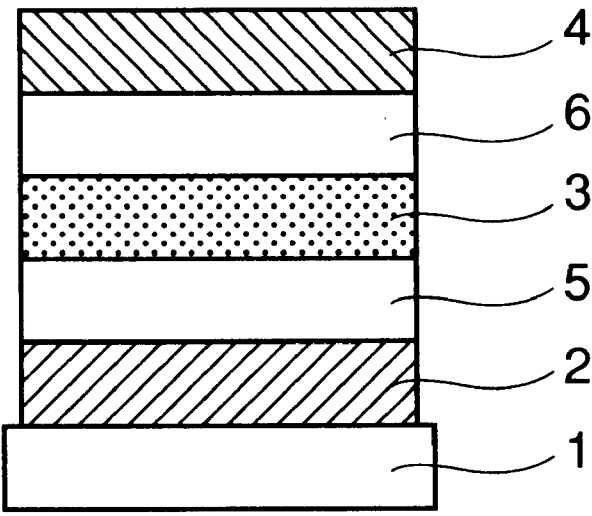

In another embodiment shown in FIG. 3, the organic layer is composed of three layers consisting of a hole transport layer 5, a luminescence layer 3 and an electron transport layer 6 disposed in this order on the anode 2. In this embodiment, carrier (hole/electron) transport performances and luminescence performance are functionally separated into three layers which may appropriately be formed by using functional materials exhibiting hole transport performance, electron transport performance and luminescence performance, respectively. As a result, it is possible to allow not only an increased latitude in selection of materials, but also use of various compounds having different emission wavelengths, thus resulting in a variety of emission hues. Further, it also becomes possible to effectively confine respective carriers or excitons in the luminescence layer 3, thus improving luminescence efficiency.

Figure 4:
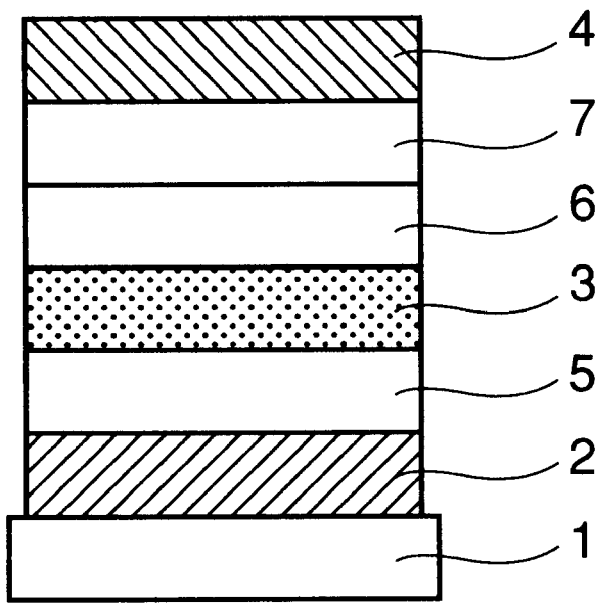

FIG. 4 shows another embodiment of the organic luminescence device of the present invention. Referring to FIG. 4, the organic luminescence device has four layers as the organic layers including three functional layers similar to those (hole transport layer 5, luminescence layer 3 and electron transport layer 6) shown in FIG. 3 and further an electron injection layer 7 disposed between the cathode 4 and the electron transport layer 6. The use of the electron injection layer 7 is effective in improving adhesive properties between the cathode 4 and the electron transport layer 6 or electron injection performance, thus resulting in luminescence at a low applied voltage.

Figure 5:
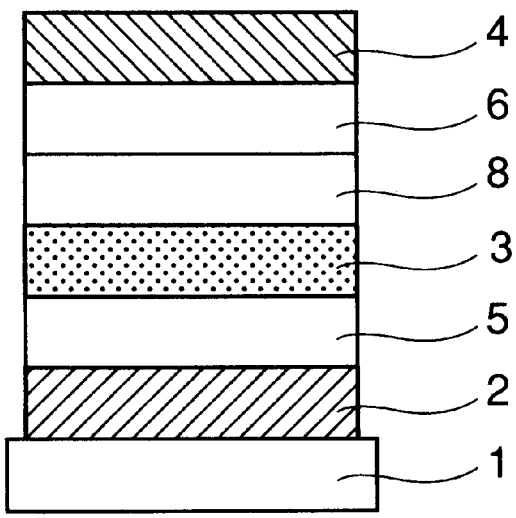
Figure 6:
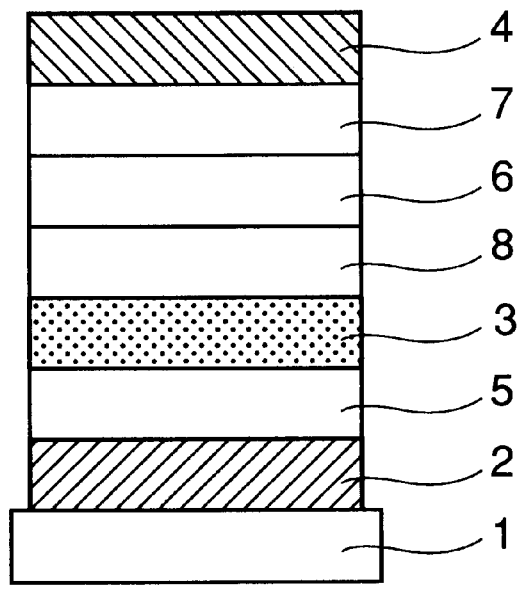

FIGS. 5 and 6 show other embodiments similar to those shown in FIGS. 3 and 4, respectively, except that a hole (or exciton) blocking layer 8 for blocking passing of holes or excitons to the cathode side is disposed between the electron transport layer 6 and the luminescence layer 3. In these embodiments, by using a compound exhibiting a very high ionization potential in the hole blocking layer 8, a resultant luminescence efficiency is effectively improved.

In the above-mentioned layer structures of organic luminescence devices of the present invention, between the cathode 4 and the luminescence layer 3, the electron transport layer 6 or the electron injection layer 7 may generally be disposed in contact with the cathode 4, and the electron transport layer 6 or the hole blocking layer 8 may generally be disposed in contact with the luminescence layer 3. Further, the electron injection layer 7 and the hole blocking layer 8 may generally have a thickness smaller than the electron transport layer 6.

The layer structure of organic luminescence devices of the present invention using the above-mentioned fused polynuclear compound is not restricted to those described above with reference to FIGS. 1–6 which illustrate basic device structures of the organic luminescence device of the present invention.

The fused polynuclear compound used in the present invention (represented by any one of formulae (I) to (III)) may preferably be used as a material suitable for the electron injection layer, the electron transport layer and/or the luminescence layer, but may appropriately be used, as desired, in combination with conventionally known materials, such as hole transport compounds, luminescent compounds and/or electron transport compounds shown below.

Hole Transport Materials

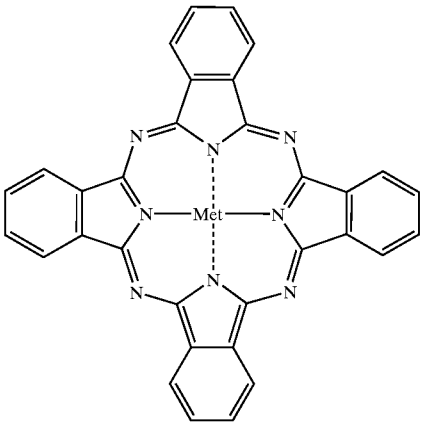

Met-Pc

Met = Cu, Mg, AlCl, TiO$_2$, SnCl$_2$, etc.

TPD

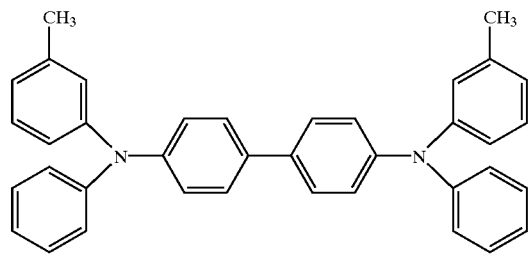

DTDPFL

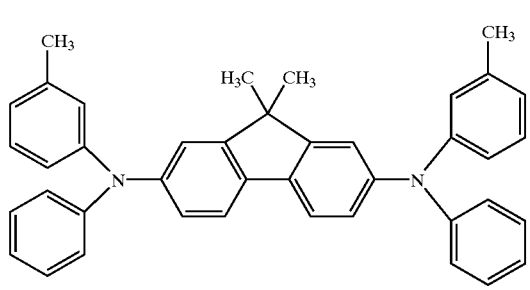

a-NPD

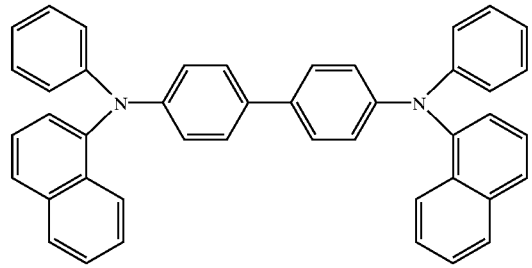

spiro-TPD

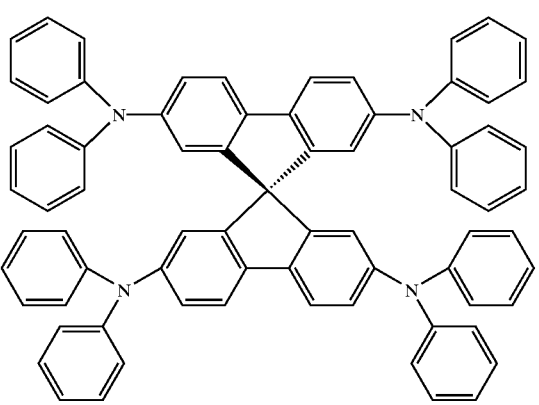

m-MTDATA

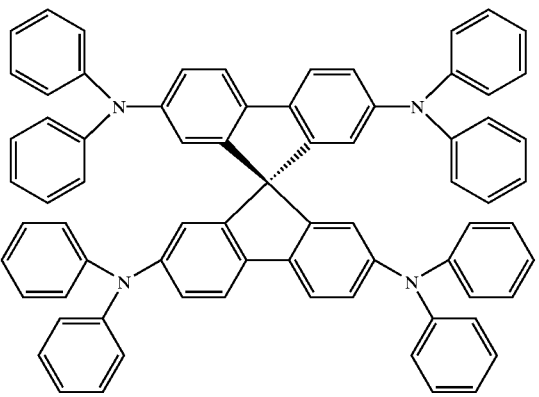

TPAC

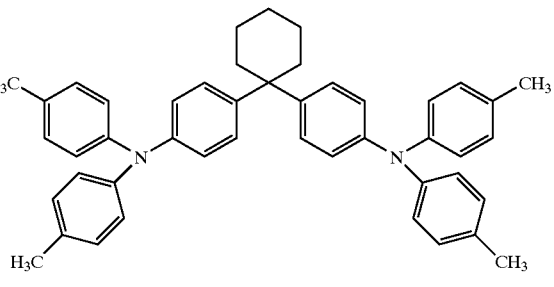

-continued
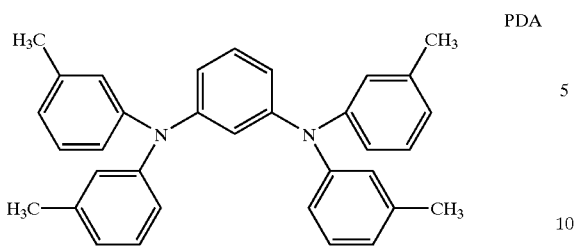
PDA
Electron Transport Luminescence Materials
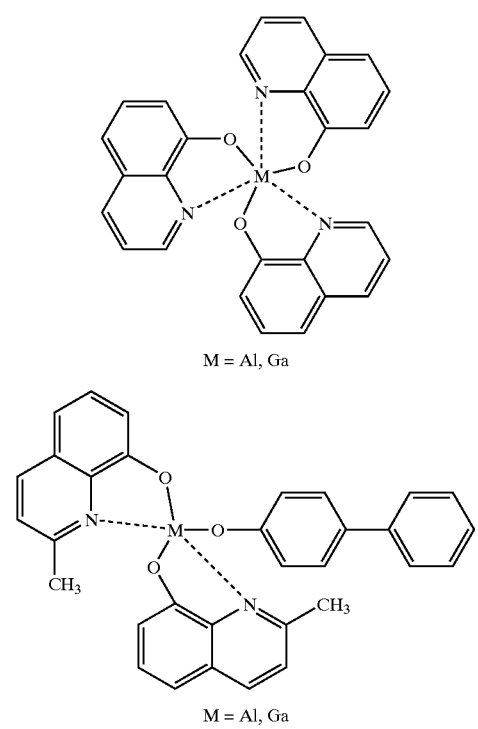
-continued
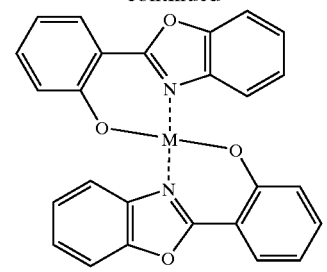

Luminescence Materials
Coumarin 6
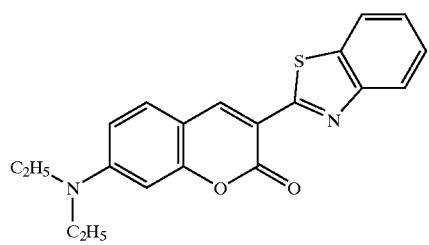
DCM-1
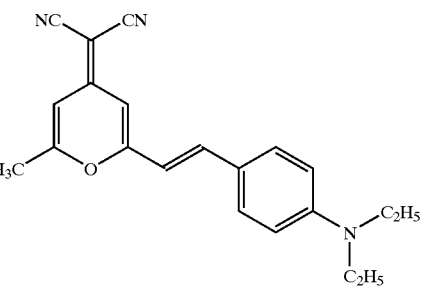
Nile red
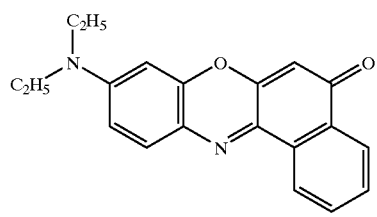
Quinacridone
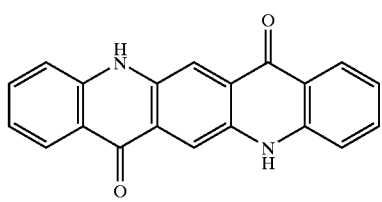
DPABVi
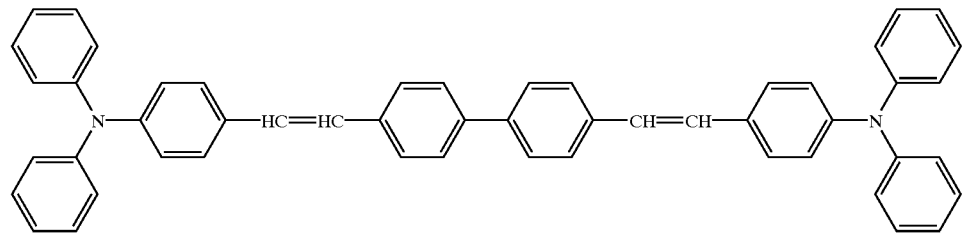
Rubrene
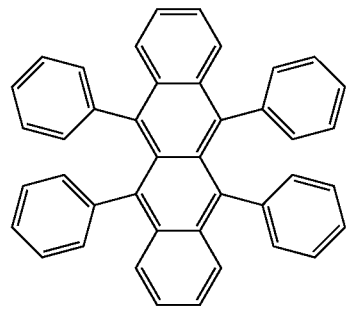
(5, 6, 11, 12-tetra-phenylnaphthacene)
Coronene
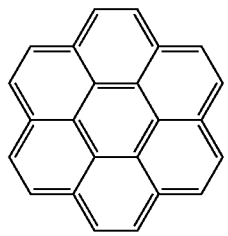
Luminescence Layer Matrix (Host) Materials and Electron Transport Materials
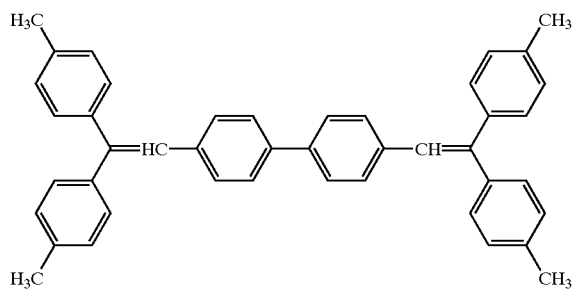
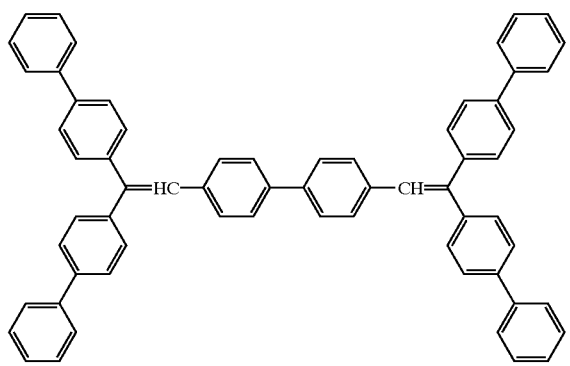

-continued
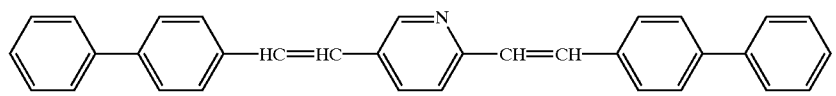
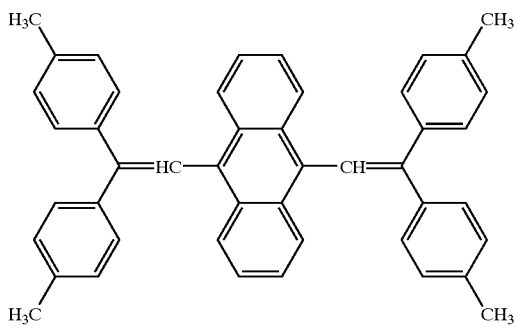
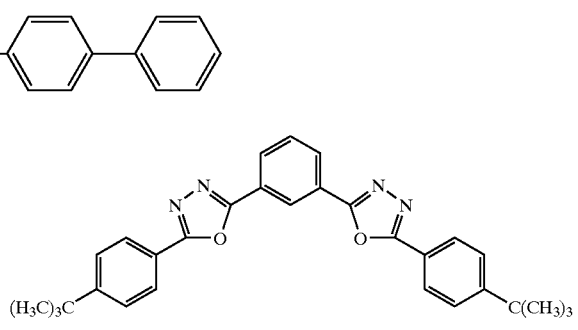
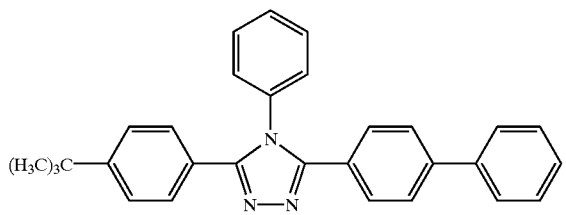
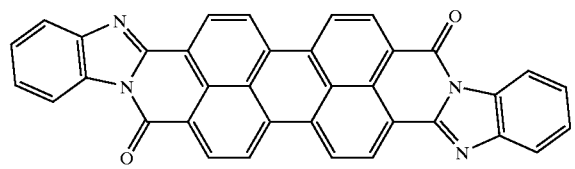
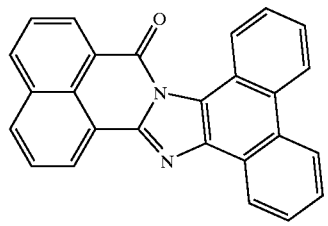
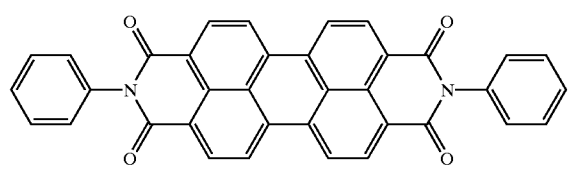
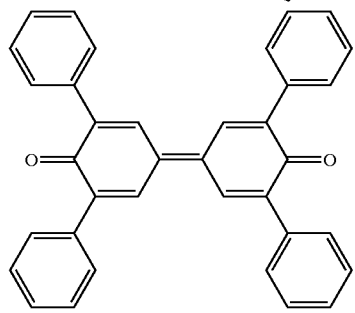
50
Polymer-Type Hole Transport Materials
PVCz
DPA-PS
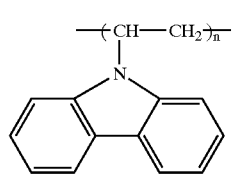
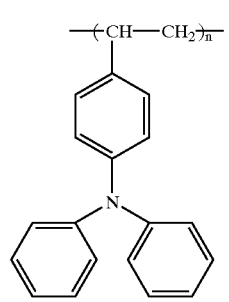

-continued
TPA-PMMA
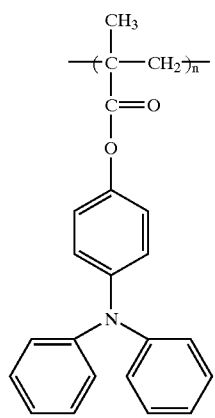
TPD-PMMA
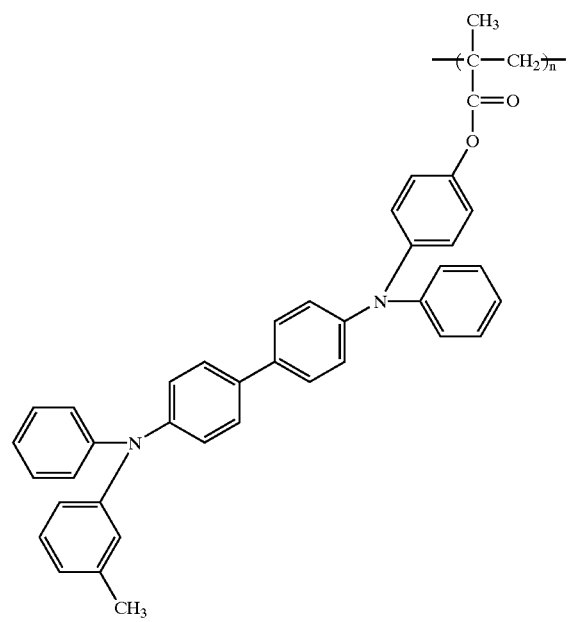
TPD-PMMA
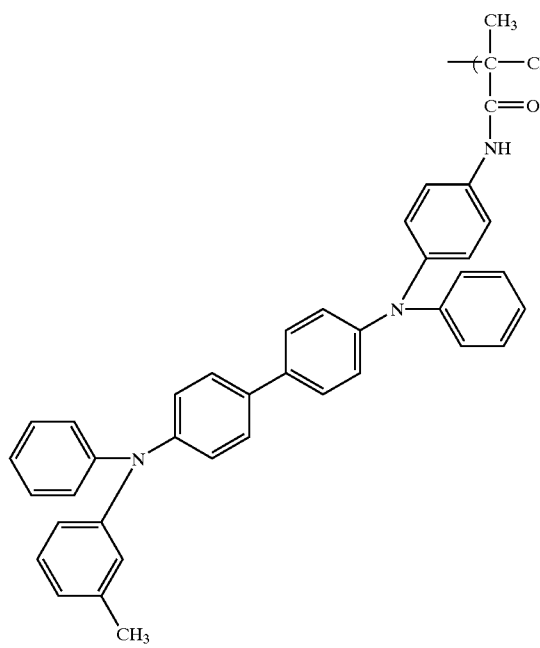
TPD-PCA
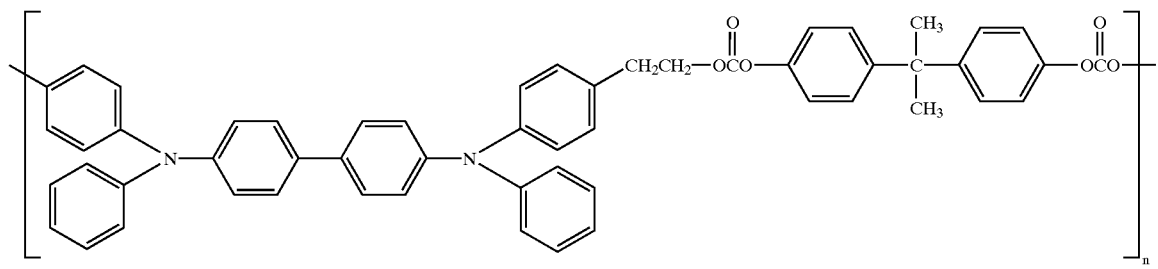

Poly thiophene

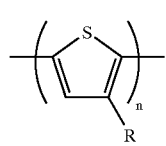

R: $C_6H_{13}$, $C_8H_{17}$, $C_{12}H_{25}$

Poly silicone

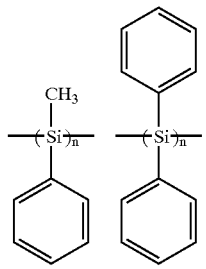

Polymer-Type Luminescence Materials and Charge Transport Materials

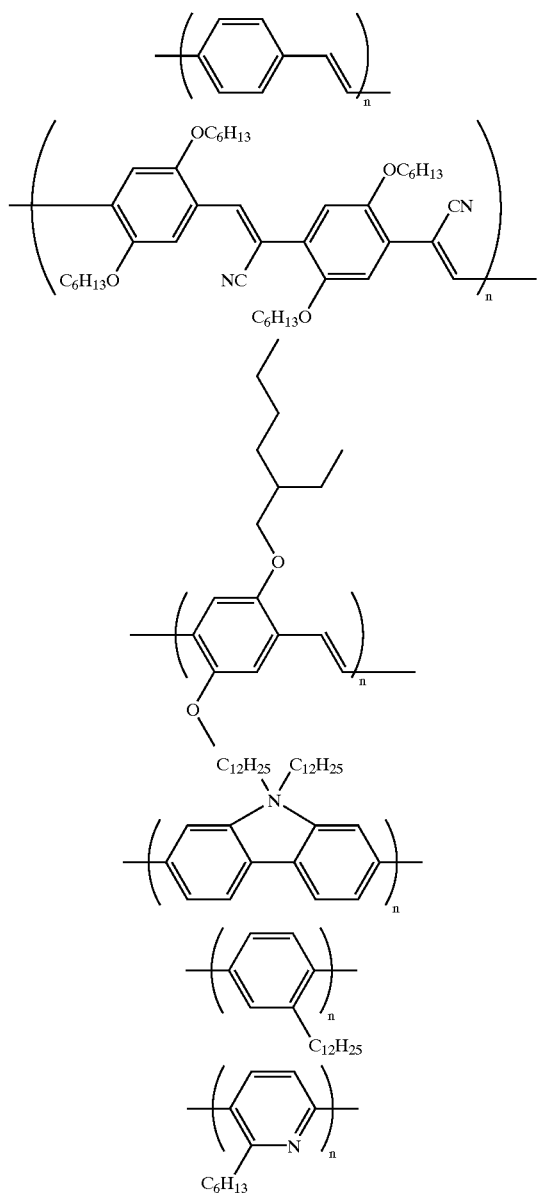

In the organic luminescence device according to the present invention, a layer of the fused polynuclear compound represented by formulae (I) to (III) and other layers comprising organic compounds may generally be formed in a thin film by vacuum deposition or wet coating using an appropriate solvent for dissolving such organic compounds (including the fused polynuclear compound). Particularly, in the case of using the wet coating, it is also possible to form a film in combination with an appropriate binder resin.

The binder resin may appropriately be selected from various known resins. Examples of the binder resin may include: polyvinyl carbazole, polycarbonate resin, polyester resin, polyarylate resin, polystyrene resin, acrylic resin, methacrylic resin, butyral resin, polyvinyl acetal resin, diallyl phthalate resin, phenolic resin, epoxy resin, silicone resin, polysulfone resin and urea resin. These resins may be used singly (as a homopolymer) or in combination of two or more species (as a copolymer).

The binder resin may preferably be used in an amount of 0.01–20 wt. parts, more preferably 0.1–10 wt. parts, per 1 wt. part of the fused polynuclear compound.

The anode (electrode) constituting the organic luminescence device of the present invention may desirably be formed of a material having a work function as large as possible. Examples of such a material may include: metals such as gold, platinum, nickel, palladium, cobalt, selenium and vanadium; alloys of those metals; and metal oxides such as tin oxide, zinc oxide, indium tin oxide (ITO) and indium zinc oxide. Further, it is also possible to use electroconductive polymers such as polyaniline, polypyrrole, polythiophene, and polyphenylene sulfide. These materials may be used alone or in mixture.

On the other hand, the cathode (electrode) may desirably be formed of a material having a work function as small as possible. Examples of such a material may include: metals such as lithium, sodium, potassium, calcium, magnesium, aluminum, indium, silver, lead, tin and chromium; and alloys of these metals. It is also possible to use metal oxides such as ITO. The cathode may be formed in a single layer or in plural layers.

The substrate for the organic luminescence device of the present invention is not particularly limited. Examples of the substrate may include an opaque substrate such as a metal substrate or ceramic substrate and a transparent substrate such as glass substrate, quartz substrate or plastic sheet. Further, it is also possible to control emitted light by using a color filter film, a fluorescent color conversion film or a dielectric reflection film, in combination with the substrate.

The organic luminescence device of the present invention may further comprise a protective layer or a sealing layer in order to prevent contact between the organic luminescence device and ambient oxygen or moisture.

Examples of the protective layer may include: a diamond film, an inorganic material film such as metal oxide or metal nitride, a polymer film such as fluorine-containing resin, polyparaxylene, polyethylene, silicone resin or polystyrene, and a photo-curable resin film. Further, it is possible to effect packaging of the organic luminescence device per se by covering, e.g., glass substrate, gas-impermeable film or metal film, with an appropriate sealing resin.

Hereinbelow, the present invention will be described more specifically based on examples but is not restricted to the examples.

EXAMPLE 1

An organic luminescence device shown in FIG. 4 was prepared in the following manner.

On a 0.7 mm-thick glass substrate 1, a 120 nm-thick ITO (indium tin oxide) film (anode 2) was formed by sputtering to prepare a transparent electroconductive support, which was then successively subjected to ultrasonic cleaning with acetone and then with isopropyl alcohol (IPA). The resultant transparent electroconductive support was then subjected to boiling cleaning with IPA and was dried, followed by UV/ozone cleaning.

On the thus-treated transparent electro-conductive support, a solution of a hole transport material shown below in chloroform was applied by spin coating to form a 20 nm-thick hole transport layer 5.

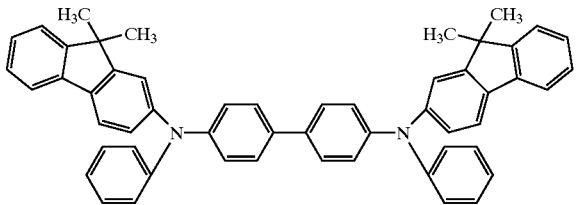

On the hole transport layer 5, a 20 nm-thick luminescence layer 3 of rubrene shown below and Alq$_3$ (aluminum tris-quinolinol) shown below (1:20 by weight) was formed by co-vacuum deposition.

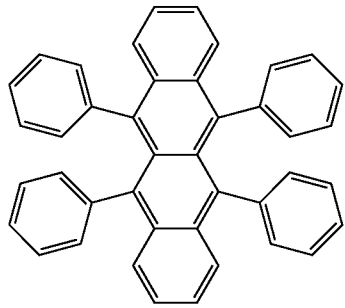

(Rubrene)

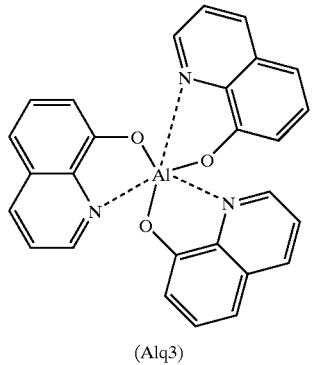

(Alq3)

On the luminescence layer 3, a 40 nm-thick electron transport layer 6 of Alq$_3$ was formed by vacuum deposition.

On the electron transport layer 6, a 10 nm-thick electron injection layer 7 of a fused polynuclear compound (Ex. Comp. No. 1) was formed by vacuum deposition under conditions including a vacuum degree (pressure) of 1.0× $10^{-4}$ Pa and a deposition rate of 0.2–0.3 nm/sec.

Then, on the electron injection layer 7, a 150 nm-thick metal electrode (cathode 4) of an aluminum-lithium alloy (Li content: 1 atomic %) was formed by vacuum deposition (1.0×$10^{-4}$ Pa; 1.0–1.2 nm/sec).

To the thus-prepared organic luminescence device as shown in FIG. 4, a DC voltage of 4 volts was applied between the ITO electrode (anode 2, positive pole) and the Al-Li electrode (cathode 4, negative pole), whereby a current was passed through the organic luminescence device at a current density of 4.5 mA/cm$^2$, and yellow luminescence was observed at a luminance of 880 cd/m$^2$.

When the organic luminescence device was supplied with a voltage for 100 hours while keeping a current density of 4.0 mA/cm$^2$ in a nitrogen atmosphere, a luminance of 810 cd/m$^2$ (as initial luminance) was decreased merely to 790 cd/m$^2$, even after 100 hours of the voltage application, thus exhibiting good durability (less deterioration in luminance). The results are also shown in Table 1 appearing hereinafter.

EXAMPLES 2–15

Organic luminescence devices were prepared and evaluated in the same manner as in Example 1 except that the fused polynuclear compound (Ex. Comp. No. 1) was changed to Ex. Comp. Nos. 4, 8, 10, 13, 16, 18, 20, 23, 24, 26, 28, 32, 34 and 35, respectively.

The results are shown in Table 1.

COMPARATIVE EXAMPLE 1

An organic luminescence device was prepared and evaluated in the same manner as in Example 1 except that the electron injection layer 7 was not formed.

The results are shown in Table 2.

COMPARATIVE EXAMPLES 2–4

Organic luminescence devices were prepared and evaluated in the same manner as in Example 1 except that the fused polynuclear compound (Ex. Comp. No. 1) was changed to the following comparative compounds Nos. 1–3, respectively.

The results are shown in Table 2.

Comparative Compound No. 1

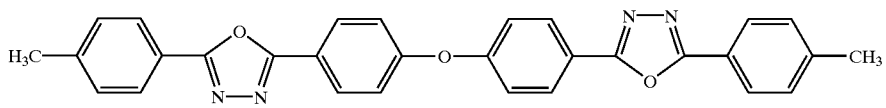

Comparative Compound No. 2

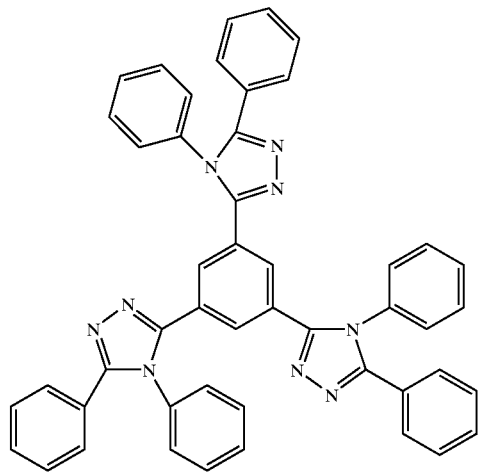

Comparative Compound No. 3

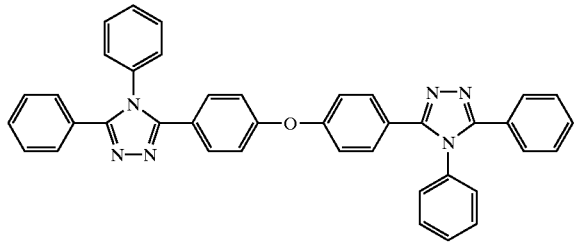

TABLE 1

| Ex. No. | Comp. No. | Applied voltage (V) | Initial Luminance (cd/m²) | Luminance (at 4.0 mA/cm²) Initial (cd/m²) | After 100 hr (cd/m²) |
| --- | --- | --- | --- | --- | --- |
| 1 | 1 | 4 | 880 | 810 | 790 |
| 2 | 4 | 4 | 840 | 780 | 750 |
| 3 | 8 | 4 | 870 | 800 | 740 |
| 4 | 10 | 4 | 920 | 870 | 860 |
| 5 | 13 | 4 | 1050 | 990 | 960 |
| 6 | 16 | 4 | 1000 | 980 | 940 |
| 7 | 18 | 4 | 810 | 760 | 750 |
| 8 | 20 | 4 | 790 | 730 | 690 |
| 9 | 23 | 4 | 850 | 820 | 800 |
| 10 | 24 | 4 | 860 | 800 | 750 |
| 11 | 26 | 4 | 770 | 730 | 690 |
| 12 | 28 | 4 | 810 | 770 | 730 |
| 13 | 32 | 4 | 990 | 950 | 940 |
| 14 | 34 | 4 | 1020 | 950 | 930 |
| 15 | 35 | 4 | 960 | 920 | 890 |

TABLE 2

| Comp. Ex. No. | Comp. No. | Applied voltage (V) | Initial Luminance (cd/m²) | Luminance (at 4.0 mA/cm²) Initial (cd/m²) | After 100 hr (cd/m²) |
| --- | --- | --- | --- | --- | --- |
| 1 | None | 4 | 630 | 590 | 410 |
| 2 | Comp.1 | 4 | 260 | 240 | No luminescence |
| 3 | Comp.2 | 4 | 490 | 480 | 40 |
| 4 | Comp.3 | 4 | 190 | 180 | No luminescence |

EXAMPLE 16

An organic luminescence device shown in FIG. 3 was prepared in the following manner.

In a similar manner as in Example 1, a transparent electroconductive support was prepared.

On the transparent electroconductive support, a 40 nm-thick hole transport layer 5 of a compound shown below was formed by vacuum deposition.

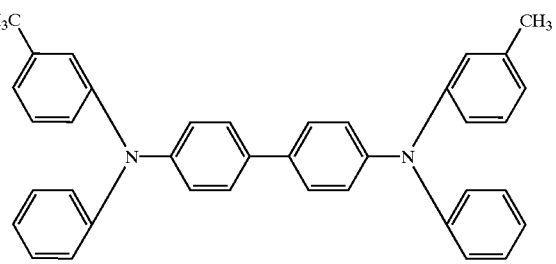

On the hole transport layer 5, a 20 nm-thick luminescence layer 3 of a compound shown below was formed by vacuum deposition.

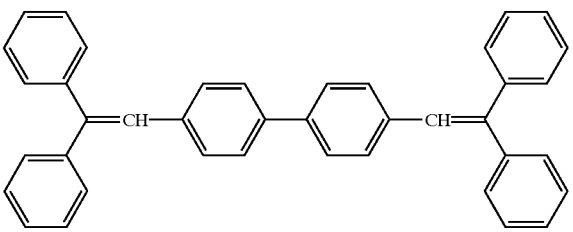

On the luminescence layer 3, a 40 nm-thick electron transport layer 6 of a fused polynuclear compound (Ex. Comp. No. 2) was formed by vacuum deposition (1.0×10⁻⁴ Pa; 0.2–0.3 nm/sec).

Then, on the electron transport layer 6, a 150 nm-thick metal electrode (cathode 4) of an aluminum-lithium alloy (Li content: 1 atomic %) was formed by vacuum deposition ($1.0 \times 10^{-4}$ Pa; 1.0–1.2 nm/sec).

To the thus-prepared organic luminescence device as shown in FIG. 3, a DC voltage of 8 volts was applied between the ITO electrode (anode 2, positive pole) and the Al-Li electrode (cathode 4, negative pole), whereby a current was passed through the organic luminescence device at a current density of 7.6 mA/cm$^2$, and blue luminescence was observed at a luminance of 3800 cd/m$^2$.

When the organic luminescence device was supplied with a voltage for 100 hours while keeping a current density of 7.0 mA/cm$^2$ in a nitrogen atmosphere, a luminance of 3650 cd/m$^2$ (as initial luminance) was decreased merely to 3500 cd/m$^2$, even after 100 hours of the voltage application, thus exhibiting good durability. The results are shown in Table 3 appearing hereinafter.

EXAMPLES 17–30

Organic luminescence devices were prepared and evaluated in the same manner as in Example 16 except that the fused polynuclear compound (Ex. Comp. No. 2) was changed to Ex. Comp. Nos. 6, 9, 12, 15, 17, 19, 21, 22, 25, 27, 29, 30, 31 and 33, respectively.

The results are shown in Table 3.

COMPARATIVE EXAMPLES 5–7

Organic luminescence devices were prepared and evaluated in the same manner as in Example 16 except that the fused polynuclear compound (Ex. Comp. No. 2) was changed to the above-mentioned comparative compounds Nos. 1–3, respectively.

The results are shown in Table 4.

TABLE 3

| Ex. No. | Comp. No. | Initial Applied voltage (V) | Luminance (cd/m$^2$) | Luminance (at 7.0 mA/cm$^2$) Initial (cd/m$^2$) | After 100 hr (cd/m$^2$) |
|---|---|---|---|---|---|
| 16 | 2  | 8 | 3800 | 3650 | 3500 |
| 17 | 6  | 8 | 3150 | 3100 | 2950 |
| 18 | 9  | 8 | 3200 | 3100 | 2900 |
| 19 | 12 | 8 | 4600 | 4300 | 4150 |
| 20 | 15 | 8 | 4850 | 4450 | 4100 |
| 21 | 17 | 8 | 4450 | 4400 | 4100 |
| 22 | 19 | 8 | 2900 | 2700 | 2450 |
| 23 | 21 | 8 | 3350 | 3200 | 3000 |
| 24 | 22 | 8 | 2800 | 2500 | 2300 |
| 25 | 25 | 8 | 3050 | 2800 | 2550 |
| 26 | 27 | 8 | 3850 | 3500 | 3350 |
| 27 | 29 | 8 | 3700 | 3500 | 3350 |
| 28 | 30 | 8 | 4300 | 4000 | 3850 |
| 29 | 31 | 8 | 4000 | 3800 | 3600 |
| 30 | 33 | 8 | 3550 | 3400 | 3300 |

TABLE 4

| Comp. Ex. No. | Comp. No. | Initial Applied voltage (V) | Luminance (cd/m$^2$) | Luminance (at 7.0 mA/cm$^2$) Initial (cd/m$^2$) | After 100 hr (cd/m$^2$) |
|---|---|---|---|---|---|
| 5 | Comp.1 | 8 | 350 | 310 | No luminescence |
| 6 | Comp.2 | 8 | 730 | 670 | 90 |
| 7 | Comp.3 | 8 | 230 | 220 | No luminescence |

EXAMPLE 31

An organic luminescence device shown in FIG. 5 was prepared in the following manner.

On a transparent electroconductive support prepared in the same manner as in Example 1, a 20 nm-thick hole transport layer 5 and a 20 nm-thick luminescence layer 3 were formed in the same manner as in Example 1.

On the luminescence layer 3, a 10 nm-thick hole blocking layer 8 of a fused polynuclear compound (Ex. Comp. No. 3) was formed by vacuum deposition.

On the hole blocking layer 8, a 40 nm-thick electron transport layer 6 of Alq3 was formed by vacuum deposition ($1.0 \times 10^{-4}$ Pa; 0.2–0.3 nm/sec).

Then, on the electron transport layer 6, a 150 nm-thick metal electrode (cathode 4) of an aluminum-lithium alloy (Li content: 1 atomic %) was formed by vacuum deposition ($1.0 \times 10^{-4}$ Pa; 1.0–1.2 nm/sec).

To the thus-prepared organic luminescence device as shown in FIG. 5, a DC voltage of 8 volts was applied between the ITO electrode (anode 2, positive pole) and the Al-Li electrode (cathode 4, negative pole), whereby a current was passed through the organic luminescence device at a current density of 7.1 mA/cm$^2$, and yellow luminescence was observed at a luminance of 7500 cd/m$^2$.

When the organic luminescence device was supplied with a voltage for 100 hours while keeping a current density of 7.0 mA/cm$^2$ in a nitrogen atmosphere, a luminance of 7300 cd/m$^2$ (as initial luminance) was decreased merely to 6950 cd/m$^2$, even after 100 hours of the voltage application, thus exhibiting good durability. The results are shown in Table 5 appearing hereinafter.

EXAMPLES 32–35

Organic luminescence devices were prepared and evaluated in the same manner as in Example 31 except that the fused polynuclear compound (Ex. Comp. No. 3) was changed to Ex. Comp. Nos. 5, 7, 11 and 14, respectively.

The results are shown in Table 5.

COMPARATIVE EXAMPLES 8–10

Organic luminescence devices were prepared and evaluated in the same manner as in Example 31 except that the fused polynuclear compound (Ex. Comp. No. 3) was changed to the above-mentioned comparative compounds Nos. 1–3, respectively.

The results are shown in Table 5.

TABLE 5

| Ex. No. | Ex. Comp. No. | Applied voltage (V) | Luminance (cd/m²) | Initial (cd/m²) | Luminance (at 7.0 mA/cm²) After 100 hr (cd/m²) |
|---|---|---|---|---|---|
| 31 | 3 | 8 | 7500 | 7300 | 6950 |
| 32 | 5 | 8 | 9350 | 9000 | 8600 |
| 33 | 7 | 8 | 8100 | 7950 | 7300 |
| 34 | 11 | 8 | 6800 | 6600 | 6200 |
| 35 | 14 | 8 | 7050 | 6900 | 6450 |
| Comp. Ex. No. 8 | Comp. Ex. Comp. No. 1 | 8 | 1350 | 1300 | 190 |
| Comp. Ex. No. 9 | Comp. Ex. Comp. No. 2 | 8 | 2600 | 2450 | 600 |
| Comp. Ex. No. 10 | Comp. Ex. Comp. No. 3 | 8 | 950 | 900 | 50 |

As described hereinabove, according to the present invention, by using a fused polynuclear compound of formula (I) (preferably formula (II) or (III)) as a material for an organic luminescence functioning layer, particularly for an electron injection layer, an electron transport layer, or a hole blocking layer, disposed in contact with a cathode or a luminescence layer in an organic luminescence device, the resultant organic luminescence device allows a high luminance luminescence at a lower applied voltage and is also excellent in durability.

The organic luminescence device of the present invention can be readily prepared by vacuum deposition or wet coating, thus being produced in a large area device relatively inexpensively.

What is claimed is:

1. An organic luminescence device, comprising:
   a pair of an anode and a cathode, and
   at least one organic layer disposed between the anode and the cathode, wherein
   said at least one organic layer comprises a layer of a fused polynuclear compound represented by the following formula (I):

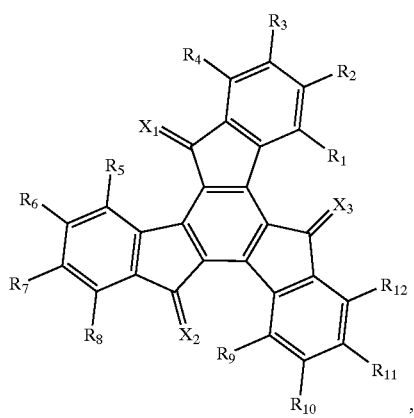

(I)

wherein $R_1$ to $R_{12}$ independently denote a hydrogen atom, an alkyl group, a substituted or unsubstituted aralkyl group, a substituted or unsubstituted aryl group, a substituted or unsubstituted heterocyclic group, a substituted amino group, a cyano group or a halogen atom; $R_1$ to $R_4$, $R_5$ to $R_8$ and $R_9$ to $R_{12}$ being independently capable of including adjacent two groups forming a substituted or unsubstituted aliphatic cyclic structure, a substituted or unsubstituted aromatic ring structure, or a substituted or unsubstituted heterocyclic structure, and $X_1$, $X_2$ and $X_3$ independently denote an oxygen atom, a sulfur atom, $C(CN)_2$, $C(CF_3)_2$, $C(Ar_1)Ar_2$ or N—$Ar_3$, wherein $Ar_1$, $Ar_2$ and $Ar_3$ independently denote a substituted or unsubstituted aryl group or a substituted or unsubstituted heterocyclic group; $Ar_1$ and $Ar_2$ being capable of forming a ring structure.

2. A device according to claim 1, wherein at least one of $X_1$, $X_2$ and $X_3$ in the formula (I) is $C(CN)_2$.

3. A device according to claim 1, wherein said fused polynuclear compound of the formula (I) is represented by the following formula (II):

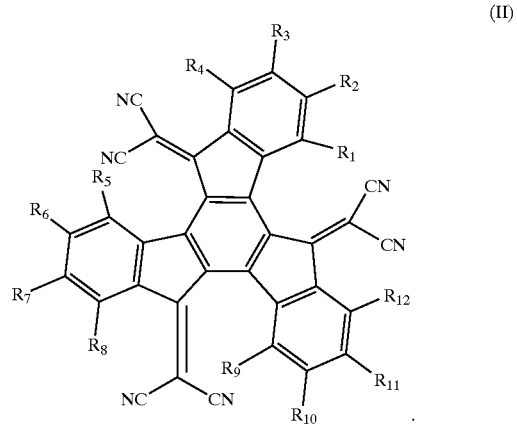

(II)

4. A device according to claim 1, wherein said fused polynuclear compound of the formula (I) is represented by the following formula (III):

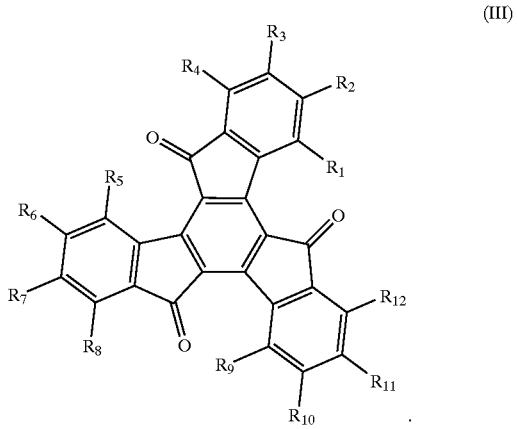

(III)

5. A device according to claim 1, wherein said at least one organic layer comprises a layer comprising at least one species of said fused polynuclear compound of the formula (I) disposed in contact with the cathode.

6. A device according to claim 3, wherein said at least one organic layer comprises a layer comprising at least one species of said fused polynuclear compound of the formula (II) disposed in contact with the cathode.

7. A device according to claim 4, wherein said at least one organic layer comprises a layer comprising at least one species of said fused polynuclear compound of the formula (III) disposed in contact with the cathode.

8. A device according to claim 1, wherein said at least one organic layer comprises a luminescence layer and a layer comprising at least one species of said fused polynuclear compound of the formula (I) disposed in contact with the luminescence layer.

9. A device according to claim 3, wherein said at least one organic layer comprises a luminescence layer and a layer comprising at least one species of said fused polynuclear compound of the formula (II) disposed in contact with the luminescence layer.

10. A device according to claim 4, wherein said at least one organic layer comprises a luminescence layer and a layer comprising at least one species of said fused polynuclear compound of the formula (III) disposed in contact with the luminescence layer.

* * * * *

UNITED STATES PATENT AND TRADEMARK OFFICE
CERTIFICATE OF CORRECTION

PATENT NO. : 6,652,997 B2
DATED : November 25, 2003
INVENTOR(S) : Koichi Suzuki et al.

It is certified that error appears in the above-identified patent and that said Letters Patent is hereby corrected as shown below:

Title page,
Item [30], Foreign Application Priority Data, "2001/131361" should read
-- 2001-131361 --.

Column 11,
Formula 18, 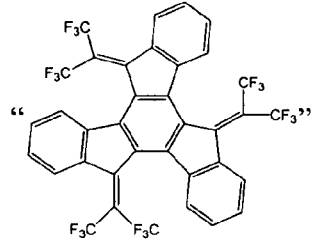 should read 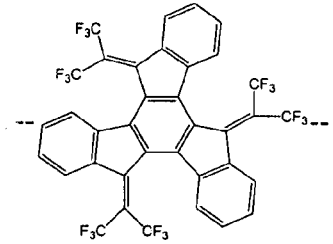

Column 35,

Line 50, 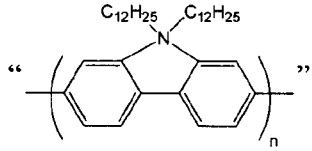 should read 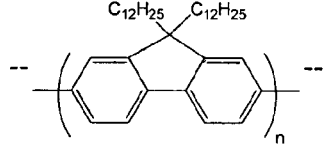

Signed and Sealed this

Sixteenth Day of August, 2005

JON W. DUDAS
*Director of the United States Patent and Trademark Office*